(12) United States Patent
Hatakeyama et al.

(10) Patent No.: US 7,741,015 B2
(45) Date of Patent: *Jun. 22, 2010

(54) PATTERNING PROCESS AND RESIST COMPOSITION

(75) Inventors: Jun Hatakeyama, Joetsu (JP); Takao Yoshihara, Joetsu (JP); Takeshi Kinsho, Joetsu (JP); Koji Hasegawa, Joetsu (JP); Yoshio Kawai, Joetsu (JP); Katsuya Takemura, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 6 days.

This patent is subject to a terminal disclaimer.

(21) Appl. No.: 12/029,940

(22) Filed: Feb. 12, 2008

(65) Prior Publication Data

US 2008/0199806 A1    Aug. 21, 2008

(30) Foreign Application Priority Data

Feb. 16, 2007  (JP) .............................. 2007-035947
Aug. 15, 2007  (JP) .............................. 2007-211654

(51) Int. Cl.
 *G03F 7/004* (2006.01)
 *G03F 7/30* (2006.01)
(52) U.S. Cl. .................. 430/312; 430/270.1; 430/326; 430/330; 430/910; 430/919; 430/920; 430/921; 430/922
(58) Field of Classification Search ................ 430/326, 430/330, 270.1, 910, 312, 919, 920, 921, 430/922
See application file for complete search history.

(56) References Cited

U.S. PATENT DOCUMENTS

| 6,448,420 | B1 | 9/2002 | Kinsho et al. |
| 6,746,818 | B2 * | 6/2004 | Kinsho et al. ............ 430/270.1 |
| 6,921,623 | B2 * | 7/2005 | Hanabata et al. ......... 430/270.1 |
| 2001/0053496 | A1 * | 12/2001 | Adams .................... 430/270.1 |
| 2005/0227174 | A1 * | 10/2005 | Hatakeyama et al. .... 430/270.1 |
| 2009/0053651 | A1 * | 2/2009 | Hatakeyama et al. .... 430/285.1 |
| 2009/0081595 | A1 * | 3/2009 | Hatakeyama et al. ....... 430/323 |

FOREIGN PATENT DOCUMENTS

| JP | 2000-327633 A | 11/2000 |
| WO | 2004-074242 A3 | 9/2004 |

OTHER PUBLICATIONS

B.J. Lin; "Semiconductor Foundry, Lithography, and Partners"; Proc. SPIE vol. 4690, pp. xxxix-xlii.
Soichi Owa et al; "Immersion lithography; its potential performance and issues"; Proc. SPIE vol. 5040, pp. 724-733 (2003).
M. Maendhoudt et al; "Double Patterning scheme for sub-0.25 k1 single damascene structures at NA=0.75, λ=193nm"; Proc. SPIE vol. 5754, pp. 1508-1517 (2005).

* cited by examiner

*Primary Examiner*—John S Chu
(74) *Attorney, Agent, or Firm*—Westerman, Hattori, Daniels & Adrian, LLP

(57) ABSTRACT

A pattern is formed by applying a positive resist composition comprising a polymer comprising 7-oxanorbornane ring-bearing recurring units and acid labile group-bearing recurring units and an acid generator onto a substrate to form a resist film, heat treating and exposing the resist film to radiation, heat treating and developing the resist film with a developer, and causing the resist film to crosslink and cure with the aid of acid and/or heat. A second resist pattern is then formed in the space area of the first resist pattern. The double patterning process reduces the pitch between patterns to one half.

14 Claims, 4 Drawing Sheet

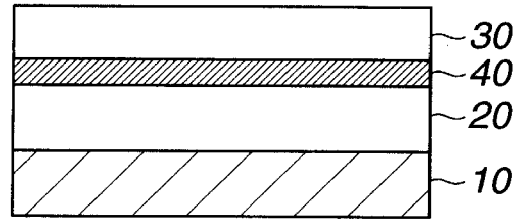
FIG.1A — APPLIY PHOTORESIST
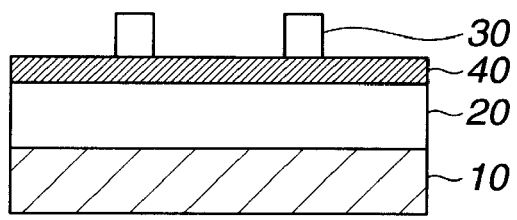
FIG.1B — EXPOSE AND DEVELOP PHOTORESIST
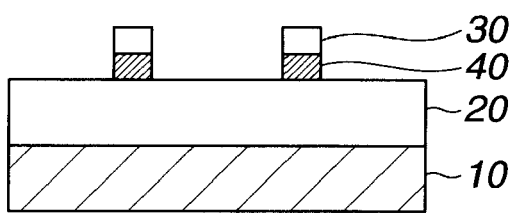
FIG.1C — ETCH HARD MASK
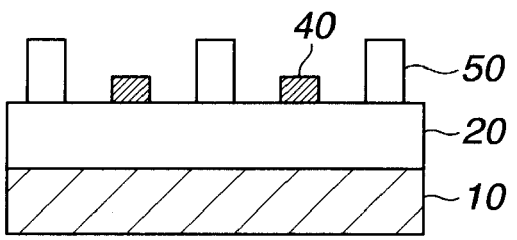
FIG.1D — APPLY, EXPOSE AND DEVELOP 2ND PHOTORESIST
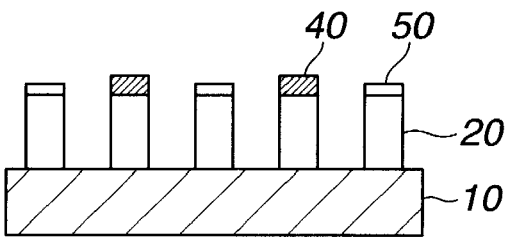
FIG.1E — ETCH PROCESSABLE SUBSTRATE

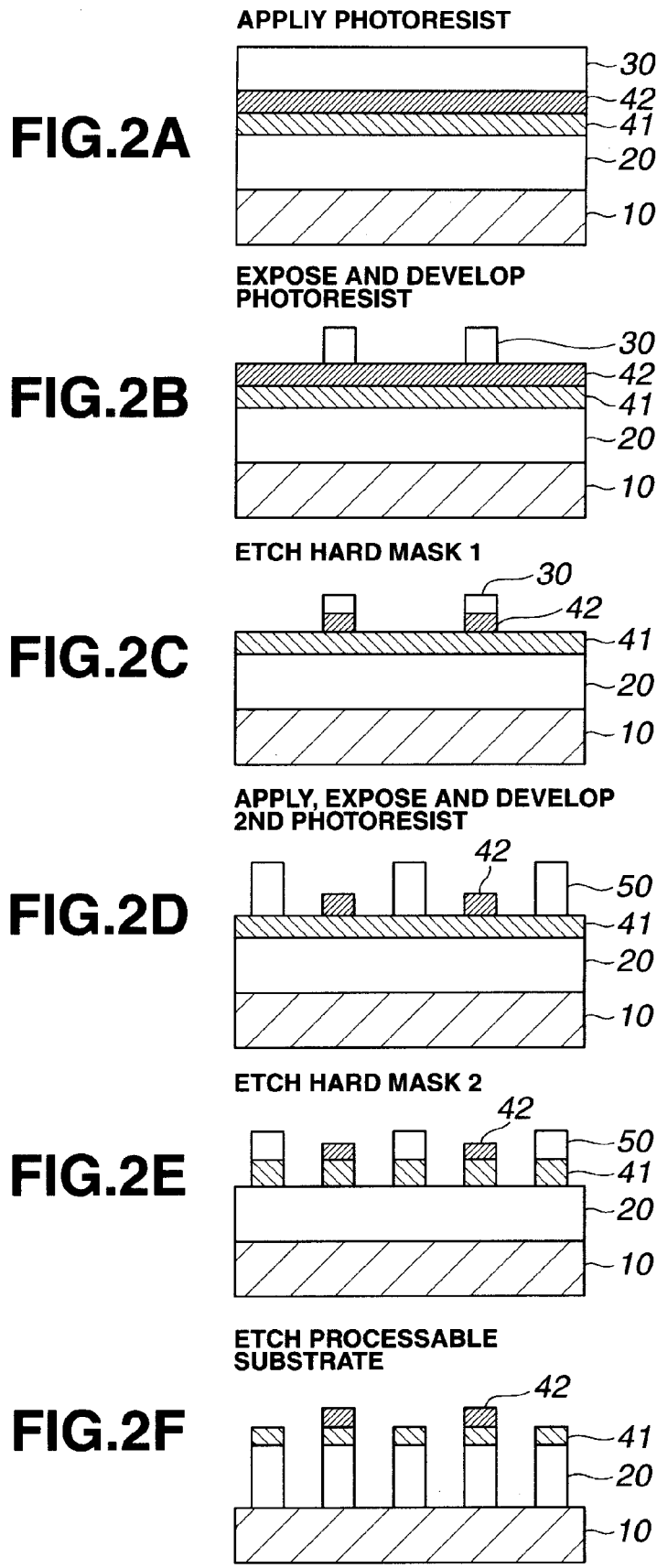

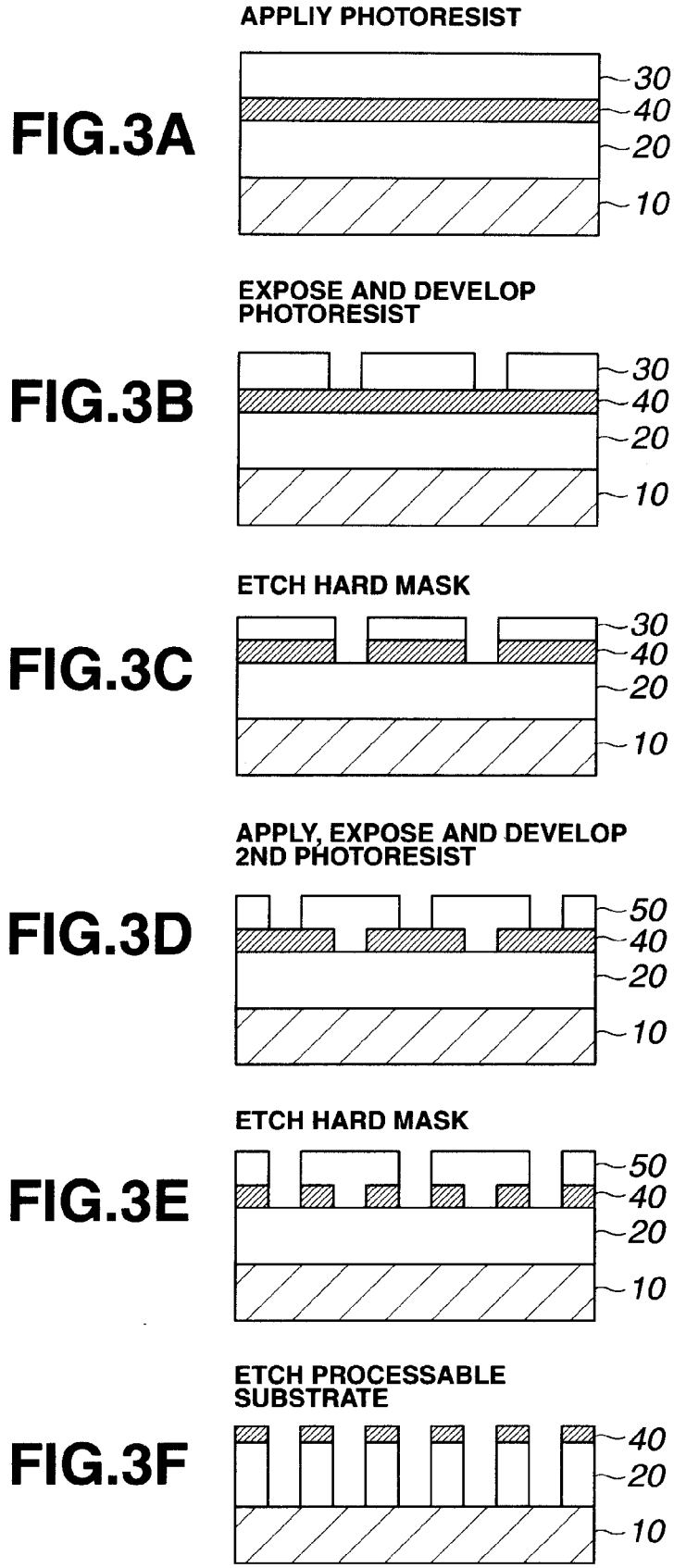

APPLY PHOTORESIST

EXPOSE AND DEVELOP PHOTORESIST

CURE PHOTORESIST PATTERN

APPLY, EXPOSE AND DEVELOP 2ND PHOTORESIST

ETCH HARD MASK

ETCH PROCESSABLE SUBSTRATE

PATTERNING PROCESS AND RESIST COMPOSITION

CROSS-REFERENCE TO RELATED APPLICATION

This non-provisional application claims priority under 35 U.S.C. §119(a) on Patent Application Nos. 2007-035947 and 2007-211654 filed in Japan on Feb. 16, 2007 and Aug. 15, 2007, respectively, the entire contents of which are hereby incorporated by reference.

TECHNICAL FIELD

This invention relates to a pattern forming process comprising a first exposure step to form a first pattern having spaces and a second exposure step to form a line pattern on the first pattern space area for thereby reducing the distance between the patterns, and a resist composition for use with the process.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm.

However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of $\frac{1}{100}°$ C. while it was recognized that the impact of heat from the resist film upon light exposure drew little concern. There was a likelihood that micro-bubbles in water could be transferred to the pattern. The risk of bubble generation could be obviated by thorough deaeration of water and the risk of bubble generation from the resist film upon light exposure is substantially nil. At the initial stage in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724). Efforts have also been made to develop lenses of NA 1.35.

One candidate for the 32-nm node lithography is lithography using vacuum ultraviolet (EUV) radiation with wavelength 13.5 nm. The EUV lithography has many accumulative problems to be overcome, including increased laser output, increased sensitivity, increased resolution and minimized line edge roughness (LWR) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LUAG ($Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between the first pattern portions. See Proc. SPIE, Vol. 5754, p 1508 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. Since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELAX method of coating a water-soluble film on the trench pattern as developed and heating to induce crosslinking at the resist film surface for achieving shrinkage of the trench pattern. These have the drawbacks that the proximity bias is degraded and the process is further complicated, leading to a reduced throughput.

Both the former and latter processes require two etchings for substrate processing, leaving the issues of a reduced throughput and deformation and misregistration of the pattern by two etchings. In particular, the double patterning process using a trench pattern requires a more stringent precision of alignment because a misalignment leads directly to a dimensional deviation of line width.

To proceed with a single etching, one method is by using a negative resist material in a first exposure and a positive resist material in a second exposure. Another method is by using a positive resist material in a first exposure and a negative resist material in a higher alcohol of 4 or more carbon atoms, in which the positive resist material is not dissolvable, in a second exposure. In these methods using negative resist materials with low resolution, degradation of resolution occurs.

A method which do not involve post-exposure bake (PEB) and development between first and second exposures is the simplest method. This method involves first exposure, replacement by a mask having a shifted pattern drawn, second exposure, PEB, development and dry etching. Since the throughput is substantially reduced by mask replacement on every exposure, the first exposure is carried out in a somewhat integrated manner before the second exposure is carried out. Then, depending on the holding time between the first exposure and the second exposure, a dimensional variation due to acid diffusion and a profile variation such as T-top profile formation occur. To suppress the T-top formation, application of a resist protective film is effective. Application of a resist protective film for immersion lithography enables a process involving two exposures, one PEB, development and dry etching. First exposure and second exposure may be consecutively carried out by two scanners arranged side by side. This gives rise to such problems as misregistration due to lens aberration between the two scanners and the doubled scanner cost.

If a common resist surface is subjected to exposure under the condition that the first exposure and the second exposure are shifted half-pitch, no pattern is generally formed because the first exposure light offsets the second exposure light. If a contrast enhancement layer (CEL) is applied, the light incident on the resist film becomes nonlinear so that the contrast is increased, and no offset occurs between half-pitch shifted exposures. Then the resist protective film for the double patterning desirably has a function of CEL. Also, if a nonlinear acid generator capable of two-photon absorption is used, it is theoretically possible to carry out double patterning exposures using solely the resist film without CEL. However, an acid generator capable of two-photon absorption has not been reported in conjunction with exposure at wavelength 200 nm or below.

The most critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

The issue of line edge roughness of resist patterns becomes serious. While a dimensional variation of gate electrodes is a problem that governs the transistor performance, the magnitude of line edge roughness becomes a factor of causing variations to the threshold current of transistors as the feature size becomes increasingly finer. It is intended to reduce the line edge roughness through improvements in the resist material, dry etching technology or photoresist process. For the resist material, a contrast increase by increasing the amounts of both acid generator and quencher added, a reduction of swelling in alkaline developer by incorporating adhesive groups such as fluoroalcohol or lactone, and the like contribute to the roughness reduction. For the photoresist process, flow processes such as thermal flow after development and bromine plasma treatment are effective. However, the flow processes have the problem of size changes due to pattern deformation and pattern shrinkage.

DISCLOSURE OF THE INVENTION

As discussed above, when substrate processing is carried out by double dry etchings using a resist pattern fabricated by double exposures and developments, the throughput is reduced to one half. Also an issue of pattern misregistration by dry etchings occurs.

An object of the invention is to provide a pattern forming process which involves curing of a resist coating having specific functional groups for preventing intermixing between first and second resist films, in order to enable a double patterning process of processing a substrate by a single dry etching; and a resist composition for use with the process.

The above and other objects can be achieved by a pattern forming process and a resist composition as defined below.

A first embodiment of the invention provides a process for forming a pattern, comprising the steps of applying a positive resist composition onto a substrate to form a resist film, the resist composition comprising a polymer and an acid generator, the polymer comprising 7-oxanorbornane ring-bearing recurring units and recurring units which become soluble in an alkaline developer under the action of an acid; heat treating the resist film and exposing it to high-energy radiation; heat treating the exposed resist film and developing it with a developer; and thereafter, causing the resist film to crosslink and cure with the aid of acid and/or heat.

A second embodiment of the invention provides a process for forming a pattern, comprising the steps of applying a positive resist composition onto a substrate to form a resist film, the resist composition comprising a polymer and an acid generator; heat treating the resist film and exposing it to high-energy radiation; heat treating the exposed resist film and developing it with a developer; and thereafter, causing the resist film to crosslink and cure with the aid of acid and/or heat. The polymer comprises recurring units (a-1) and/or (a-2) represented by the general formula (I) and recurring units which become soluble in an alkaline developer under the action of an acid.

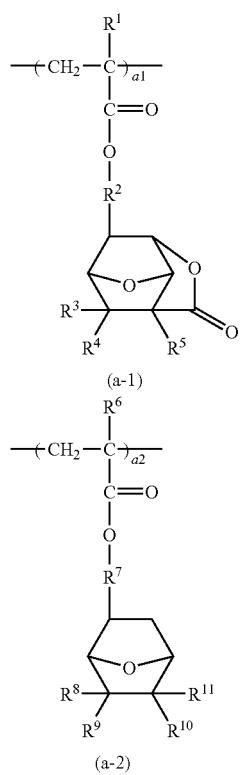

(1)

(a-1)

(a-2)

Herein $R^1$ and $R^6$ are each independently hydrogen, methyl or hydroxymethyl; $R^2$ and $R^7$ are each independently a single bond or a straight, branched or cyclic alkylene group of 1 to 6 carbon atoms, which may have an ether or ester group, with the proviso that when $R^2$ and $R^7$ each are a straight, branched or cyclic alkylene group of 1 to 6 carbon atoms, it has a carbon atom attached to the ester moiety in the formula which is primary or secondary; $R^3$, $R^4$, $R^5$, $R^8$, $R^9$, $R^{10}$, and $R^{11}$ are each independently hydrogen or a straight, branched or cyclic alkyl group of 1 to 6 carbon atoms, a1 and a2 are numbers in the range: $0 \leq a1 < 1.0$, $0 \leq a2 < 1.0$, and $0 < a1 + a2 < 1.0$.

A third embodiment of the invention provides a process for forming a pattern, comprising the steps of applying a positive resist composition onto a substrate to form a resist film, the resist composition comprising a polymer and an acid generator; heat treating the resist film and exposing it to high-energy radiation; heat treating the exposed resist film and developing it with a developer; then causing the resist film to crosslink and cure with the aid of acid and/or heat to form a first pattern; applying another positive resist composition on the first pattern and the substrate to form another resist film; heat treating and exposing the other resist film to high-energy radiation; and heat treating and developing the other resist film with a developer to form a second pattern. The polymer comprises recurring units (a-1) and/or (a-2) represented by the general formula (1) and recurring units which become soluble in an alkaline developer under the action of an acid.

In the pattern forming process of the third embodiment, preferably the first pattern includes spaces where the other resist film is left behind to form the second pattern so that the distance between the patterns is reduced by one half. Also preferably, after the first and second patterns are formed, the substrate is processed by dry etching.

In all the embodiments, the preferred acid generator is a combination of an acid generator capable of generating an acid upon exposure and another acid generator capable of generating an acid upon heating at 150 to 400° C.

In all the embodiments, the step of causing the resist film to crosslink and cure with the aid of acid and/or heat after development typically includes exposure or heating to generate an acid from the resist film, then heating at 150 to 400° C. for crosslinking the resist film to turn it insoluble in a solvent and the alkaline developer.

In all the embodiments, the recurring units which become soluble in an alkaline developer under the action of an acid typically have the general formula (b):

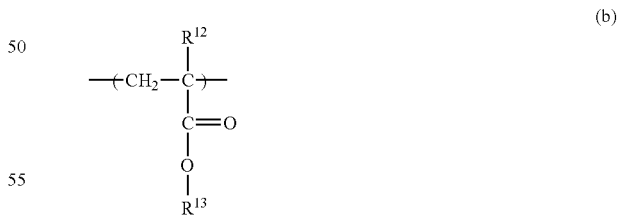

(b)

wherein $R^{12}$ is hydrogen, methyl or hydroxymethyl, and $R^{13}$ is an acid labile group.

Also contemplated herein is a positive resist composition for use in the pattern forming process defined above, comprising a polymer, an organic solvent, and an acid generator. The polymer comprises recurring units (a-1) and/or (a-2) having the general formula (I) and recurring units having the general formula (b).

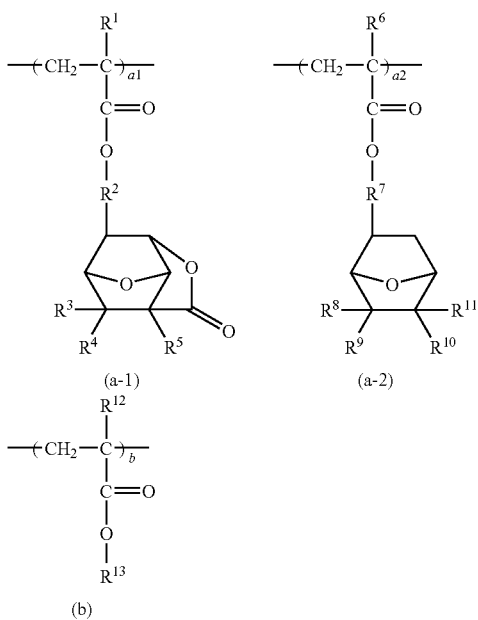

(a-1) (a-2) (b)

Herein $R^1$ and $R^6$ are each independently hydrogen, methyl or hydroxymethyl, $R^2$ and $R^7$ are each independently a single bond or a straight, branched or cyclic alkylene group of 1 to 6 carbon atoms, which may have an ether or ester group, with the proviso that when $R^2$ and $R^7$ each are a straight, branched or cyclic alkylene group of 1 to 6 carbon atoms, it has a carbon atom attached to the ester moiety in the formula which is primary or secondary, $R^3$, $R^4$, $R^5$, $R^8$, $R^9$, $R^{10}$, and $R^{11}$ are each independently hydrogen or a straight, branched or cyclic alkyl group of 1 to 6 carbon atoms, $R^{12}$ is hydrogen, methyl or hydroxymethyl, $R^{13}$ is an acid labile group; a1, a2 and b are numbers in the range: $0 \leq a1 < 1.0$, $0 \leq a2 < 1.0$, $0 < a1+a2 < 1.0$, $0 < b \leq 0.8$, and $0.1 \leq a1+a2+b \leq 1.0$. The acid generator has the general formula (P1a-1) or (P1a-2).

Herein $R^{101a}$, $R^{101b}$, and $R^{101c}$ are each independently a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, which may have at least one hydrogen atom substituted by an alkoxy group, or $R^{101b}$ and $R^{101c}$ may form a ring, and each of $R^{101b}$ and $R^{101c}$ is an alkylene group of 1 to 6 carbon atoms when they form a ring; $K^-$ is a sulfonic acid in which at least one alpha position is fluorinated, or a perfluoroalkyl imide acid or perfluoroalkyl methide acid; $R^{101d}$, $R^{101e}$, $R^{101f}$, and $R^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, which may have at least one hydrogen atom substituted by an alkoxy group, or $R^{101d}$ and $R^{101e}$, or $R^{101d}$, $R^{101e}$, and $R^{101f}$ may form a ring, and each of $R^{101d}$ and $R^{101e}$, or of $R^{101d}$, $R^{101e}$, and $R^{101f}$ is an alkylene group of 3 to 10 carbon atoms or a hetero-aromatic ring having incorporated therein the nitrogen atom in the formula, when they form a ring.

Optionally, the positive resist composition may further comprise a dissolution inhibitor, a basic compound and/or a surfactant as an additive.

BENEFITS OF THE INVENTION

According to the invention, a first pattern is formed through exposure and development using a positive resist composition comprising a polymer obtained through copolymerization of 7-oxanorbornane ring-bearing recurring units and acid labile group-bearing recurring units and an acid generator. Through acid and/or heat-induced crosslinking reaction, the first pattern is then insolubilized in alkaline developer and resist solution. A resist solution is further applied onto the first pattern, exposed and developed to form a second pattern in the space area of the first pattern. This double patterning process reduces the pitch between patterns to one half. The substrate can be processed by a single dry etching.

BRIEF DESCRIPTION OF THE DRAWINGS

FIG. 1 is a cross-sectional view of an exemplary prior art double patterning process. FIG. 1-A shows a laminate of substrate, processable substrate, hard mask and resist film, FIG. 1-B shows the resist film being exposed and developed, FIG. 1-C shows the hard mask being etched, FIG. 1-D shows a second resist film being formed, exposed and developed, and FIG. 1-E shows the processable substrate being etched.

FIG. 2 is a cross-sectional view of another exemplary prior art double patterning process. FIG. 2-A shows a laminate of substrate, processable substrate, 1st and 2nd hard masks and resist film, FIG. 2-B shows the resist film being exposed and developed, FIG. 2-C shows the 2nd hard mask being etched, FIG. 2-D shows, after removal of the first resist film, a second resist film being formed, exposed and developed, FIG. 2-E shows the 1st hard mask being etched, and FIG. 2-F shows the processable substrate being etched.

FIG. 3 is a cross-sectional view of a further exemplary prior art double patterning process. FIG. 3-A shows a laminate of substrate, processable substrate, hard mask and resist film, FIG. 3-B shows the resist film being exposed and developed, FIG. 3-C shows the hard mask being etched, FIG. 3-D shows, after removal of the first resist film, a second resist film being formed, exposed and developed, FIG. 3-E shows the hard mask being etched, and FIG. 3-F shows the processable substrate being etched.

FIG. 4-A shows a laminate of substrate, processable substrate, hard mask and resist film, FIG. 4-B shows the resist film being exposed and developed, FIG. 4-C shows the resist film being crosslinked, FIG. 4-D shows a second resist film being formed, exposed and developed, FIG. 4-E shows the hard mask being etched, and FIG. 4-F shows the processable substrate being etched.

DESCRIPTION OF THE PREFERRED EMBODIMENT

Figure 4A:
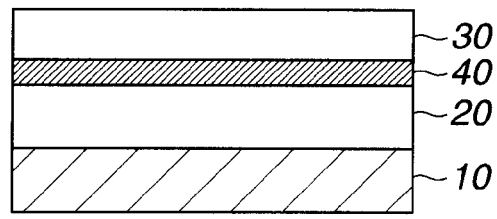
FIG. 4 is a cross-sectional view of a double patterning process according one embodiment of the invention.

The singular forms "a," "an" and "the" include plural referents unless the context clearly dictates otherwise.

As used herein, the terminology "$(C_x-C_y)$", as applied to a particular unit, such as, for example, a chemical compound or a chemical substituent group, means having a carbon atom content of from "x" carbon atoms to "y" carbon atoms per such unit.

In connection with the double patterning lithography involving double exposures and developments to form a half-pitch pattern, the inventors made efforts to develop a positive resist material which enables to process a substrate by a single dry etching.

The inventors have discovered that a double patterning process capable of reducing the pitch between patterns to one half can be practiced by applying to a substrate a resist composition comprising a polymer obtained through copolymerization of 7-oxanorbornane ring-bearing recurring units and acid labile group-bearing recurring units and an acid generator, and effecting exposure and development to form a first pattern of the positive resist composition on the substrate. Then acid and/or heat-induced crosslinking reaction is effected for rendering the first pattern insoluble in alkaline developer and resist solution. A resist solution is further applied onto the first pattern, followed by exposure and development to form a second pattern in the space area of the first pattern. Then the substrate can be processed by a single dry etching. The present invention is predicated on this discovery.

The polymer used in the pattern forming process of the invention is defined as comprising 7-oxanorbornane ring-bearing recurring units and specifically, recurring units having the general formula (a-1) and/or (a-2):

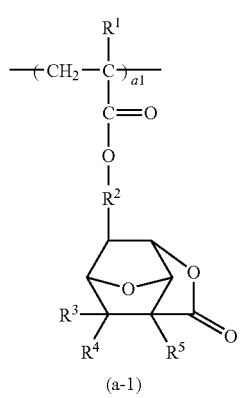

(a-1)

-continued

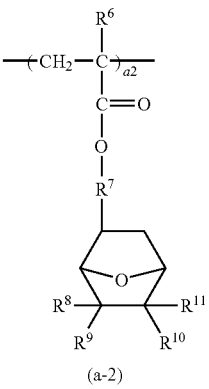

(a-2)

Herein $R^1$ and $R^6$, which may be the same or different, are hydrogen, methyl or hydroxymethyl; $R^2$ and $R^7$ are each independently a single bond or a straight, branched or cyclic alkylene group of 1 to 6 carbon atoms, which may have an ether (—O—) or ester (—COO—) group, with the proviso that when $R^2$ and $R^7$ each are a straight, branched or cyclic alkylene group of 1 to 6 carbon atoms, it has a carbon atom attached to the ester moiety in the formula which is primary or secondary; $R^3$, $R^4$, $R^5$, $R^8$, $R^9$, $R^{10}$, and $R^{11}$ are each independently hydrogen or a straight, branched or cyclic alkyl group of 1 to 6 carbon atoms; a1 and a2 are numbers in the range: $0 \leq a1 < 1.0$, $0 \leq a2 < 1.0$, and $0 < a1 + a2 < 1.0$.

Exemplary $C_1$-$C_6$ alkylene groups include methylene, ethylene, n-propylene, isopropylene, n-butylene, isobutylene, sec-butylene, n-pentylene, isopentylene, cyclopentylene, n-hexylene, and cyclohexylene.

Exemplary $C_1$-$C_6$ alkyl groups include methyl, ethyl, n-propyl, isopropyl, n-butyl, isobutyl, sec-butyl, n-pentyl, isopentyl, cyclopentyl, n-hexyl, and cyclohexyl.

Monomers from which recurring units of formulae (a-1) and (a-2) are derived include those having the following general formulae Ma1 and Ma2 wherein $R^1$ to $R^{11}$ are as defined above.

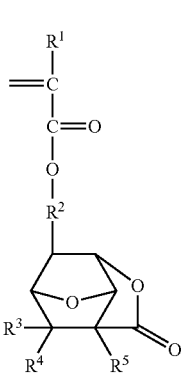

Ma1

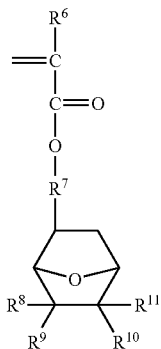
Ma2
Examples of suitable monomers are illustrated below.
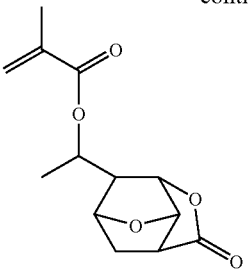 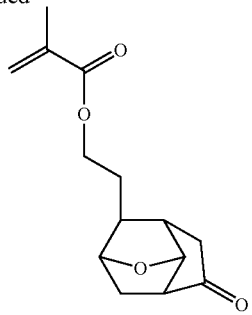
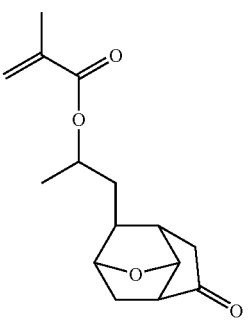 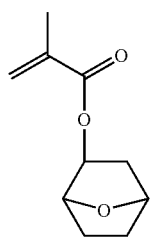
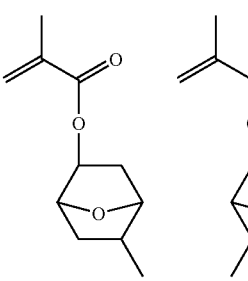 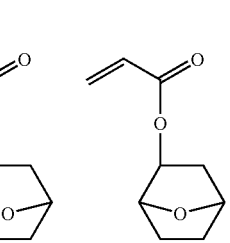
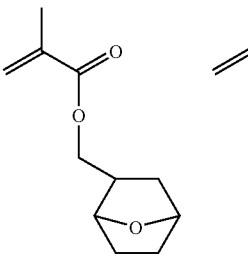 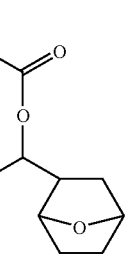
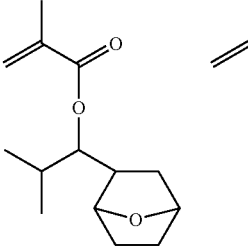 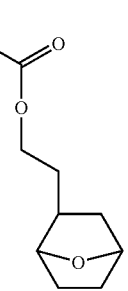

-continued
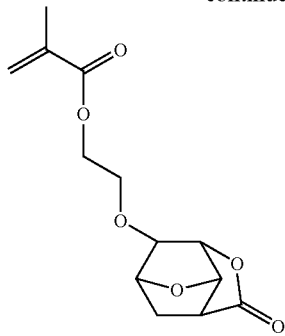 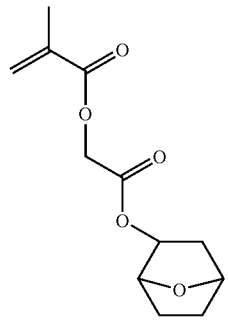 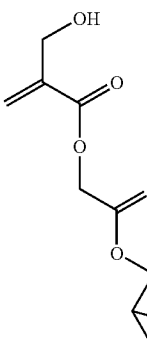  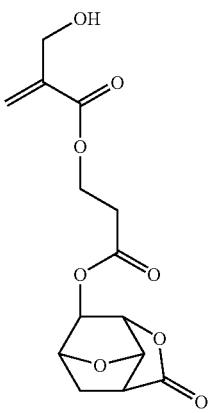
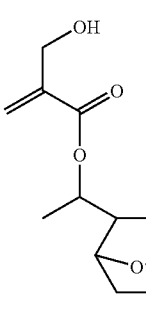 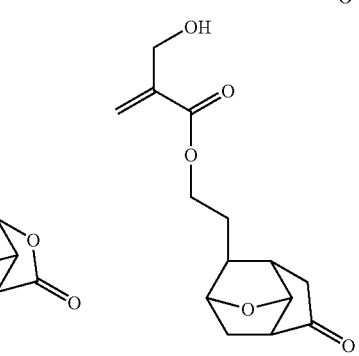
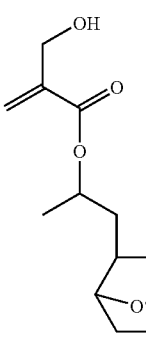 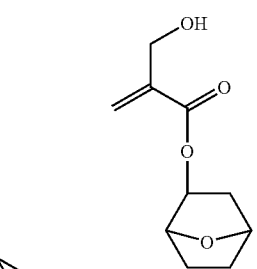
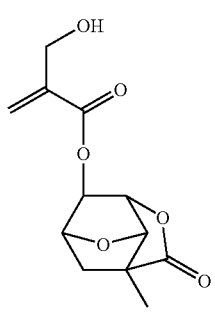 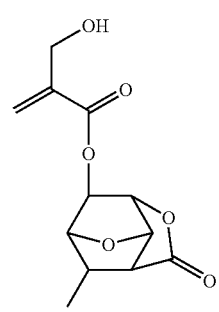 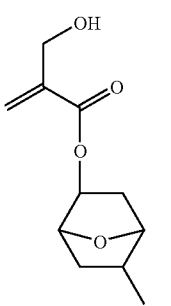 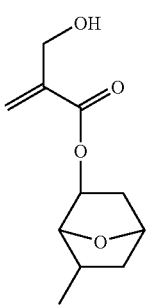
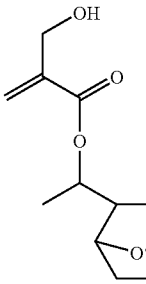 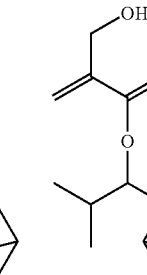
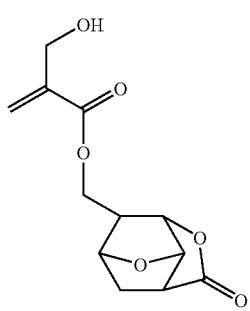

-continued

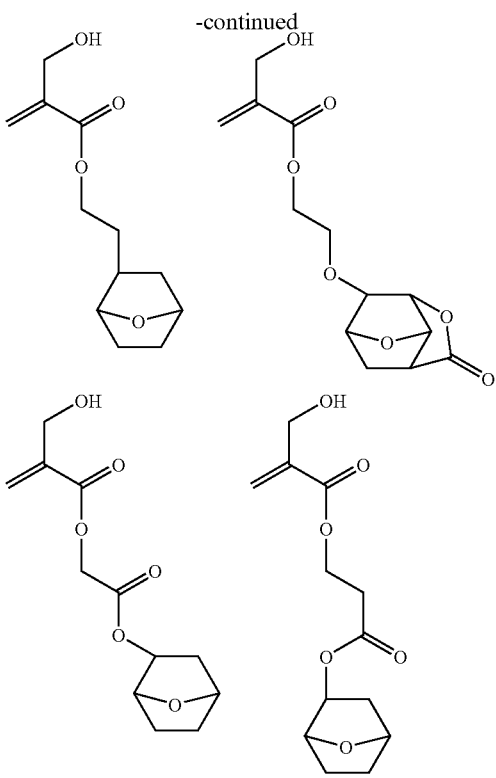

Upon polymerization, the hydroxy moiety of α-hydroxymethyl group is substituted by an acetoxy group or the like, which can be converted back to a hydroxy moiety by alkaline hydrolysis after polymerization. The α-hydroxymethyl groups serve to promote intermolecular and intramolecular crosslinking, and thus after formation of a first pattern, to increase the efficiency of pattern curing.

In order that after the first pattern is formed through exposure and development, a photoresist composition be coated thereon and processed to form a second pattern in the space area of the first pattern, the first pattern after its formation must be insoluble in photoresist solution and alkaline developer. To this end, the first pattern after its formation must be insolubilized by crosslinking so that it is insoluble in photoresist solution and alkaline developer.

When a polymer comprising recurring units having oxirane or oxetane is used as a base polymer for resist, crosslinking takes place at the temperature of resist process such as post-exposure bake (PEB) at about 90 to 130° C. because the oxirane or oxetane ring has a very high rate of acid-induced cleavage reaction. Then the polymer becomes alkali insoluble, failing to function as the positive resist material. In contrast, the 1,4-epoxy bond on the 7-oxanorbornane ring has a lower rate of acid-induced cleavage reaction than the oxirane and oxetane rings so that crosslinking does not take place in the temperature range of PEB. Then the 7-oxanorbornane ring-bearing recurring units are stable against acid during the process until development, and exert a function of enhancing adhesion and alkali solubility as a hydrophilic group. However, it is believed that under the action of the acid generated by pattern flood exposure or heating after development and heating at or above 180° C., the 1,4-epoxy bond on the 7-oxanorbornane ring undergoes ring-opening, allowing crosslinking reaction to take place, whereby the polymer becomes insoluble in alkaline developer and resist solvent. Under the action of the acid generated by pattern flood exposure or heating after development and heating at or above 180° C. as described above, the acid labile groups are deprotected. Owing to their alicyclic structure, the acid labile groups are effective in improving dry etch resistance. Although deprotection of acid labile groups leads to a lowering of dry etch resistance, crosslinking reaction due to ring-opening of 7-oxanorbornane ring achieves an improvement in dry etch resistance. These lead to an eventual improvement in etch resistance.

Accordingly, the invention provides a double patterning process capable of forming a half-pitch fine-feature-size pattern through double exposures and a single dry etching, by using as the resist base polymer a polymer comprising recurring units of a specific oxanorbornane ring structure-bearing compound which do not crosslink at the temperature of the resist process, for example, at pre-baking and PEB temperatures of about 90 to 130° C., but crosslink with the aid of the acid generated by exposure and heat after development and high-temperature baking. The positive resist composition for use in the process is also contemplated.

While the positive resist composition comprising a specific polymer as the base polymer is used in the pattern forming process of the invention, a preferred embodiment relates to a polymer comprising crosslinkable recurring units having the general formula (a-1) and/or (a-2) and acid labile group-bearing recurring units having the general formula (b).

Herein $R^{12}$ is hydrogen, methyl or hydroxymethyl, $R^{13}$ is an acid labile group, and b is a number in the range: $0<b\leq 0.8$.

Monomers from which recurring units of formula (b) are derived include those having the following general formula Mb wherein $R^{12}$ and $R^{13}$ are as defined above.

The acid labile groups represented by $R^{13}$ in formula (b) may be selected from a variety of such groups. Preferred acid labile groups are groups of formulae (AL-10) and (AL-11), tertiary alkyl groups of 4 to 40 carbon atoms represented by formula (AL-12), and oxoalkyl groups of 4 to 20 carbon atoms, but not limited thereto.

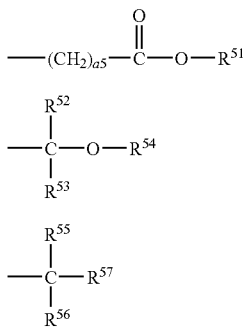

(AL-10)

(AL-11)

(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

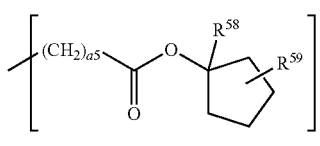
(AL-10)-1

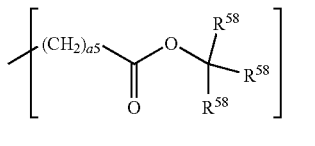
(AL-10)-2

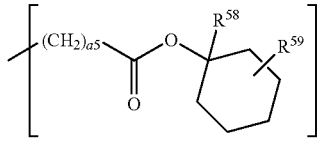
(AL-10)-3

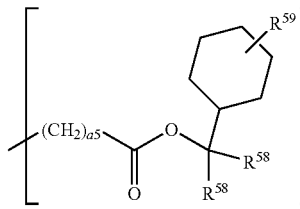
(AL-10)-4

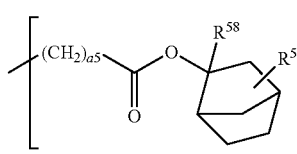
(AL-10)-5

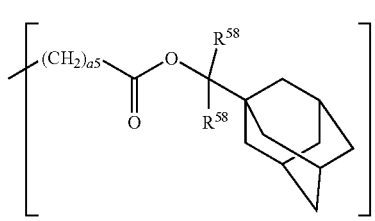
(AL-10)-6

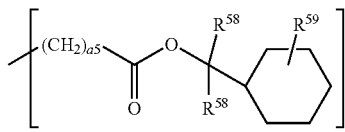
(AL-10)-7

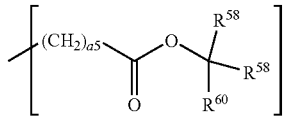
(AL-10)-8

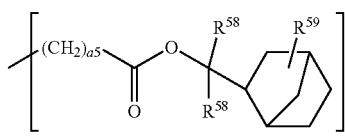
(AL-10)-9

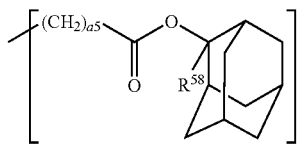
(AL-10)-10

In formulae (AL-10)-1 to (AL-10)-10, $R^{58}$ is independently a straight, branched or cyclic $C_1$-$C_8$ alkyl group, $C_6$-$C_{20}$ aryl group or $C_1$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_1$-$C_{20}$ aralkyl group; and "a5" is an integer of 0 to 10.

Illustrative examples of the acetal group of formula (AL-11) include those of the following formulae (AL-11)-1 to (AL-11)-34.

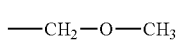
(AL-11)-1

(AL-11)-2

(AL-11)-3

-continued
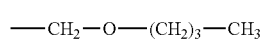
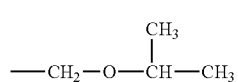
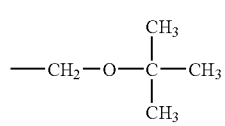
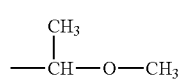
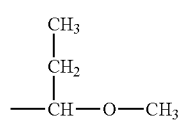
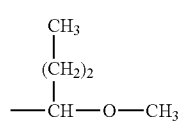
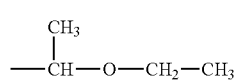
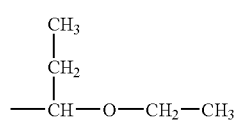
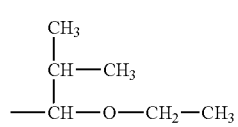
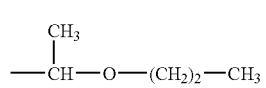
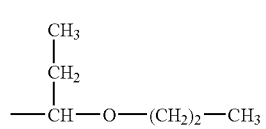
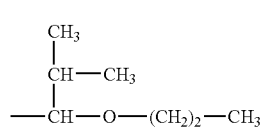
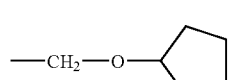
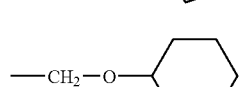
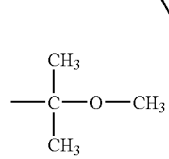
(AL-11)-4
(AL-11)-5
(AL-11)-6
(AL-11)-7
(AL-11)-8
(AL-11)-9
(AL-11)-10
(AL-11)-11
(AL-11)-12
(AL-11)-13
(AL-11)-14
(AL-11)-15
(AL-11)-16
(AL-11)-17
(AL-11)-18
-continued
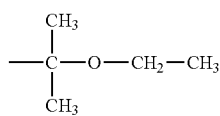
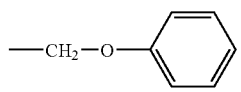
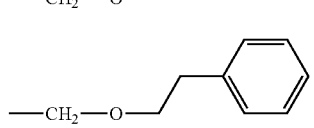
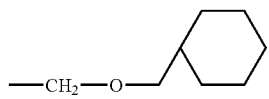
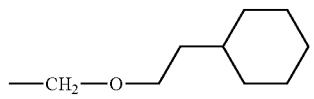
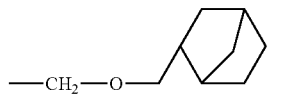
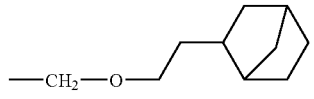
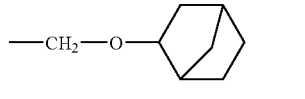
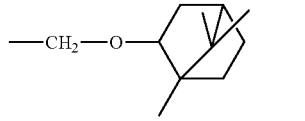
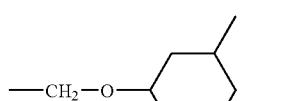
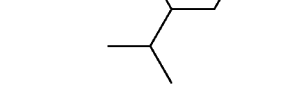
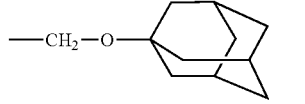
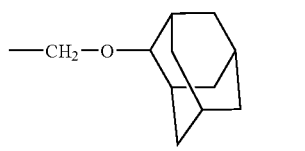
(AL-11)-19
(AL-11)-20
(AL-11)-21
(AL-11)-22
(AL-11)-23
(AL-11)-24
(AL-11)-25
(AL-11)-26
(AL-11)-27
(AL-11)-28
(AL-11)-29
(AL-11)-30
(AL-11)-31

-continued (AL-11)-32
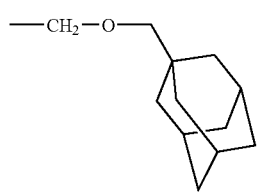

(AL-11)-33
(AL-11)-34
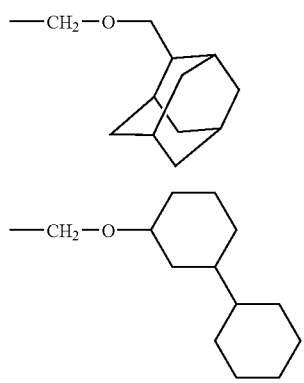

The polymer may be crosslinked within the molecule or between molecules with acid labile groups of formula (AL-11a) or (AL-11b).

(AL-11a)
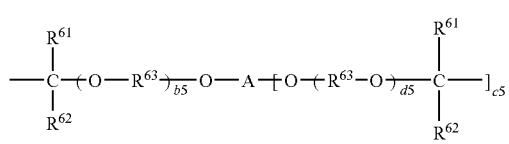

(AL-11b)
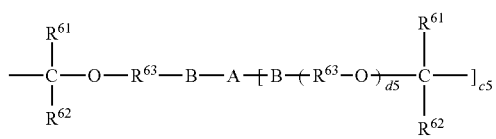

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

(AL-11)-35 (AL-11)-36
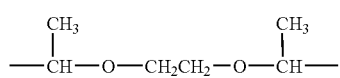

(AL-11)-37 (AL-11)-38
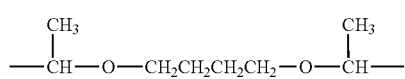

(AL-11)-39 (AL-11)-40
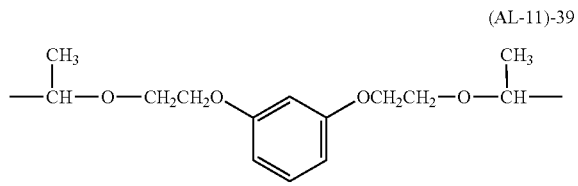

(AL-11)-41
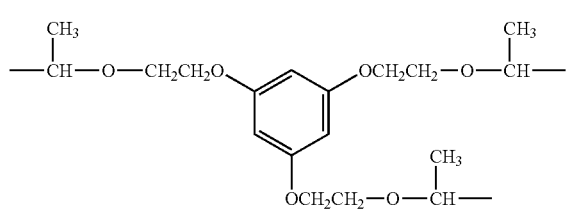

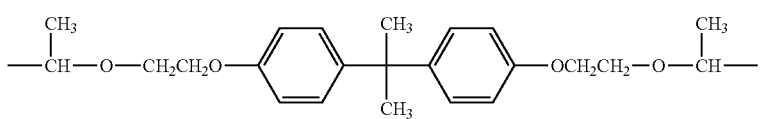
(AL-11)-42
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
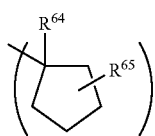
(AL-12)-1
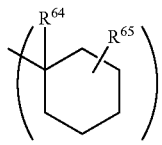
(AL-12)-2
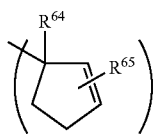
(AL-12)-3
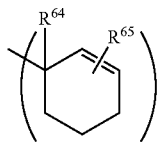
(AL-12)-4
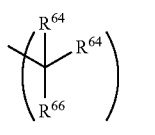
(AL-12)-5
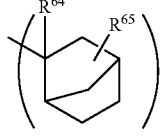
(AL-12)-6
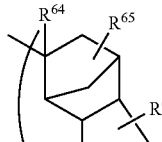
(AL-12)-7
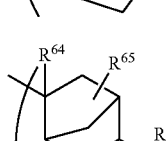
(AL-12)-8
-continued
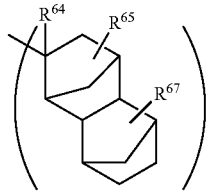
(AL-12)-9
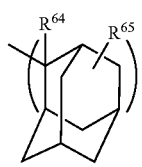
(AL-12)-10
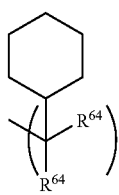
(AL-12)-11
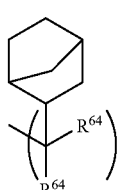
(AL-12)-12
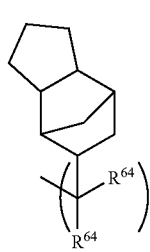
(AL-12)-13
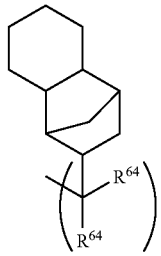
(AL-12)-14

-continued (AL-12)-15

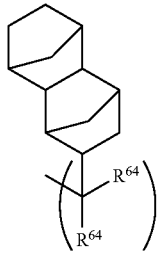

(AL-12)-16

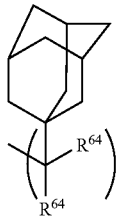

Herein $R^{64}$ is independently a straight, branched or cyclic $C_1$-$C_8$ alkyl group, $C_6$-$C_{20}$ aryl group or $C_1$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_1$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group which may contain a heteroatom such as oxygen, sulfur or nitrogen; and b6 is an integer of 1 to 3.

(AL-12)-17

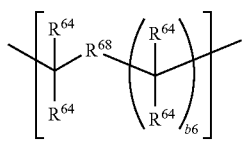

(AL-12)-18

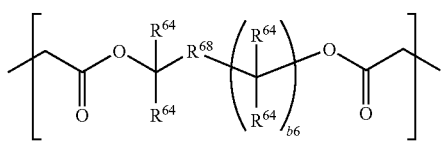

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

—(CH$_2$)$_4$OH (AL-13)-1

—(CH$_2$)$_2$O(CH$_2$)$_3$CH$_3$ (AL-13)-2

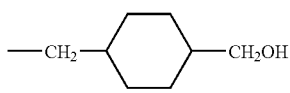 (AL-13)-3

—(CH$_2$)$_2$O(CH$_2$)$_2$OH (AL-13)-4

—(CH$_2$)$_6$OH (AL-13)-5

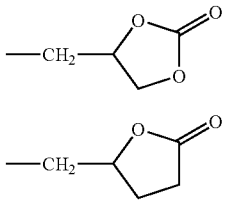 (AL-13)-6

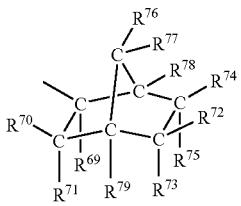 (AL-13)-7

Of the acid labile groups of formula (AL-12), recurring units having an exo-form structure represented by the formula (AL-12)-19 are preferred.

(AL-12)-19

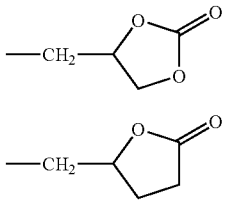

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{17}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$ or $R^{77}$ and $R^{78}$, taken together, may form a ring, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to adjoining carbon atoms may bond together directly to form a double bond. The formula also represents an enantiomer.

The ester form monomers from which recurring units having an exo-form structure represented by the formula (AL-12)-19:

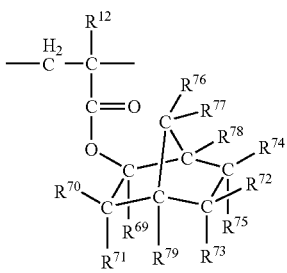

are derived are described in U.S. Pat. No. 6,448,420 (JP-A 2000-327633). Illustrative non-limiting examples of suitable monomers are given below.

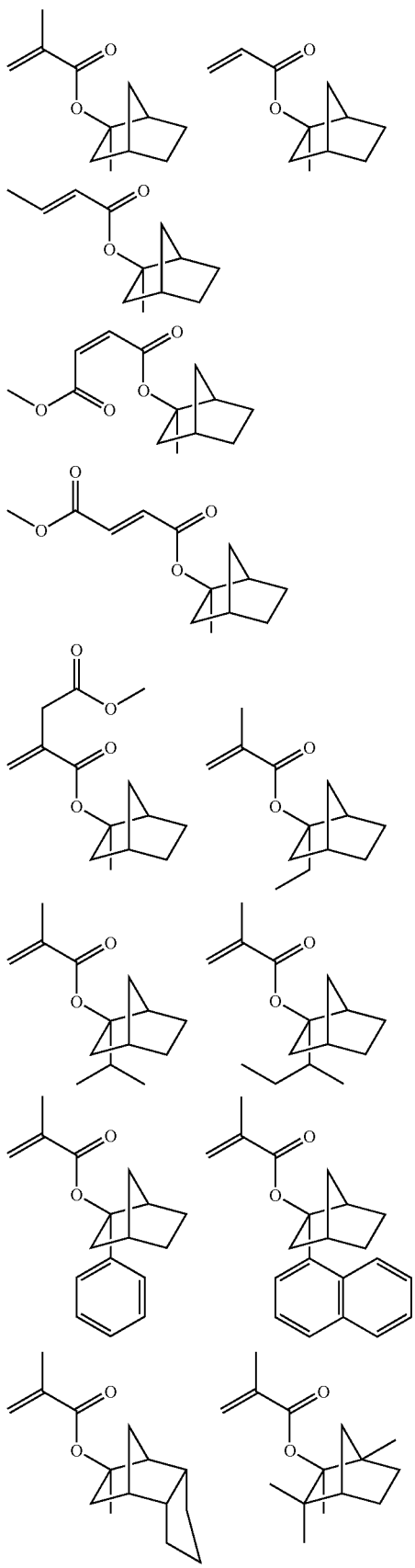
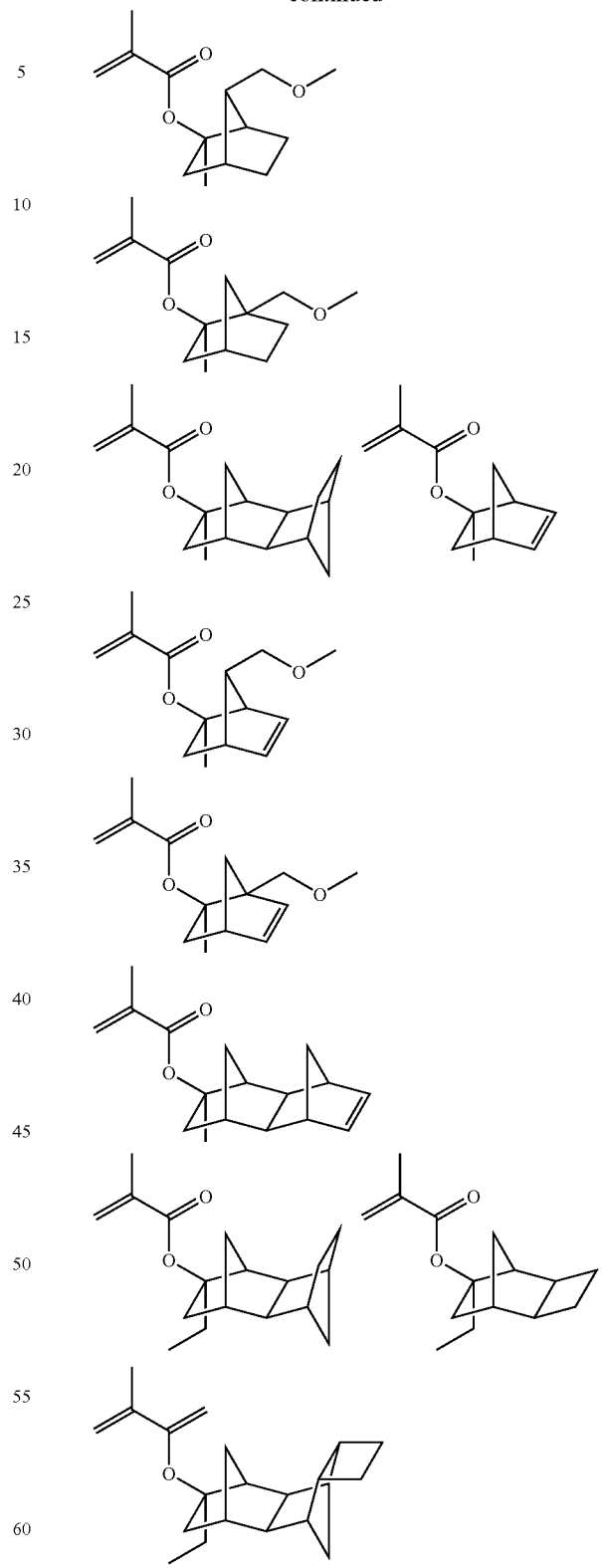
Also included in the acid labile groups of formula (AL-12) are acid labile groups having furandiyl, tetrahydrofurandiyl or oxanorbornanediyl as represented by the following formula (AL-12)-20.

(AL-12)-20

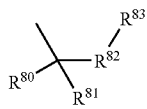

Herein, $R^{80}$ and $R^{81}$ are each independently a monovalent hydrocarbon group, typically a straight, branched or cyclic alkyl of 1 to 10 carbon atoms. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic alkyl of 1 to 10 carbon atoms, which may contain a heteroatom.

Examples of the monomers from which the recurring units substituted with acid labile groups having furandiyl, tetrahydrofurandiyl and oxanorbornanediyl as represented by the formula:

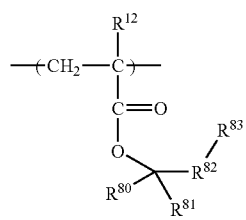

(wherein $R^{80}$, $R^{81}$, $R^{82}$ and $R^{83}$ are as defined above) are derived are shown below. Note that Me is methyl and Ac is acetyl.

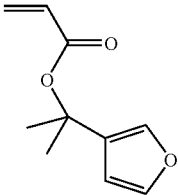

-continued

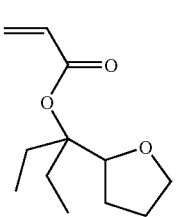

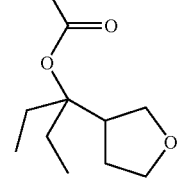

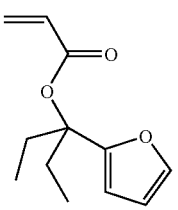

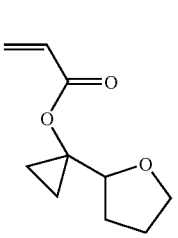

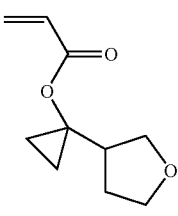

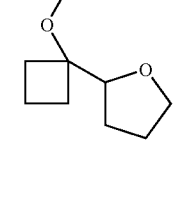

-continued
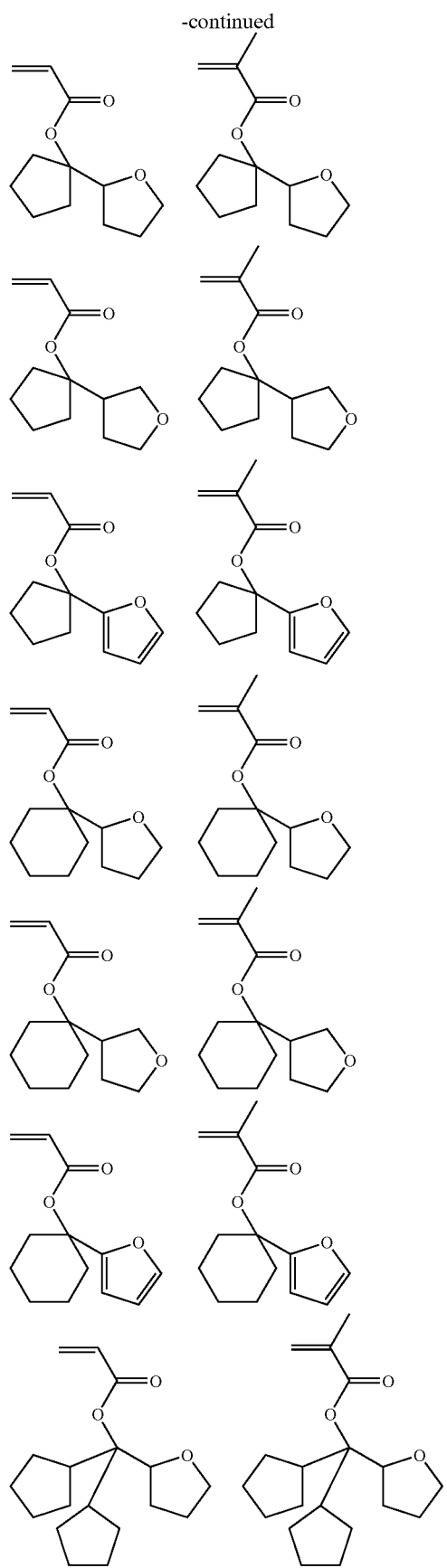
-continued
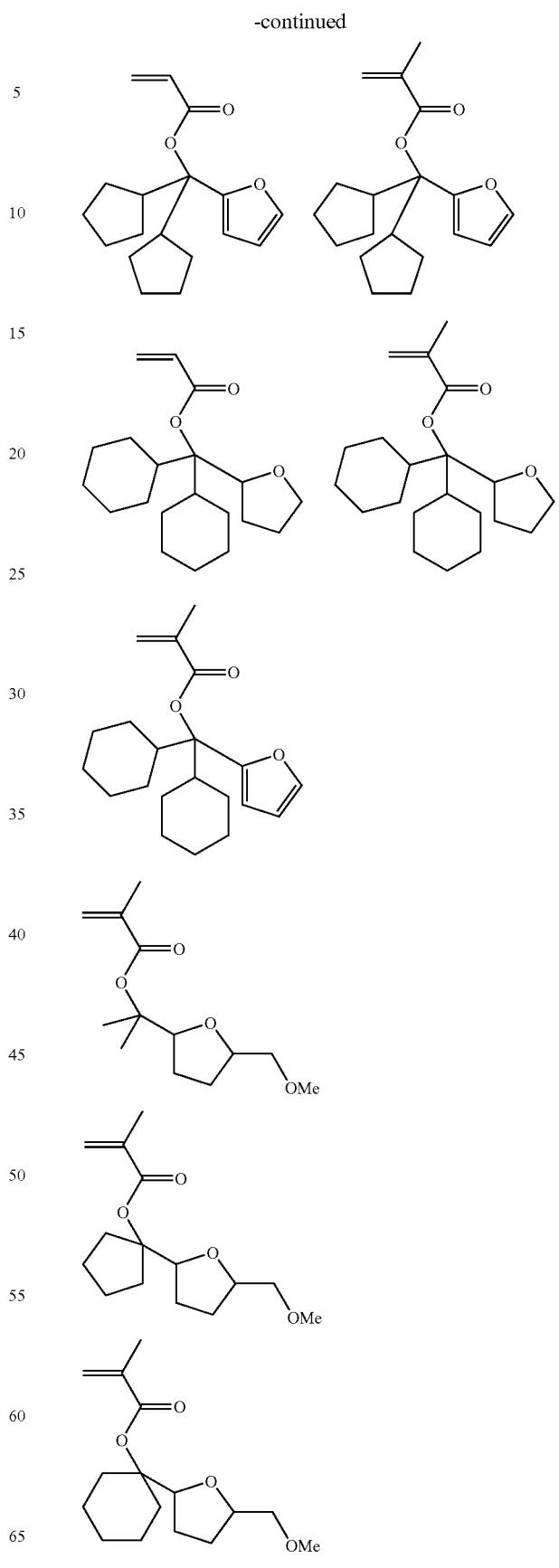

-continued

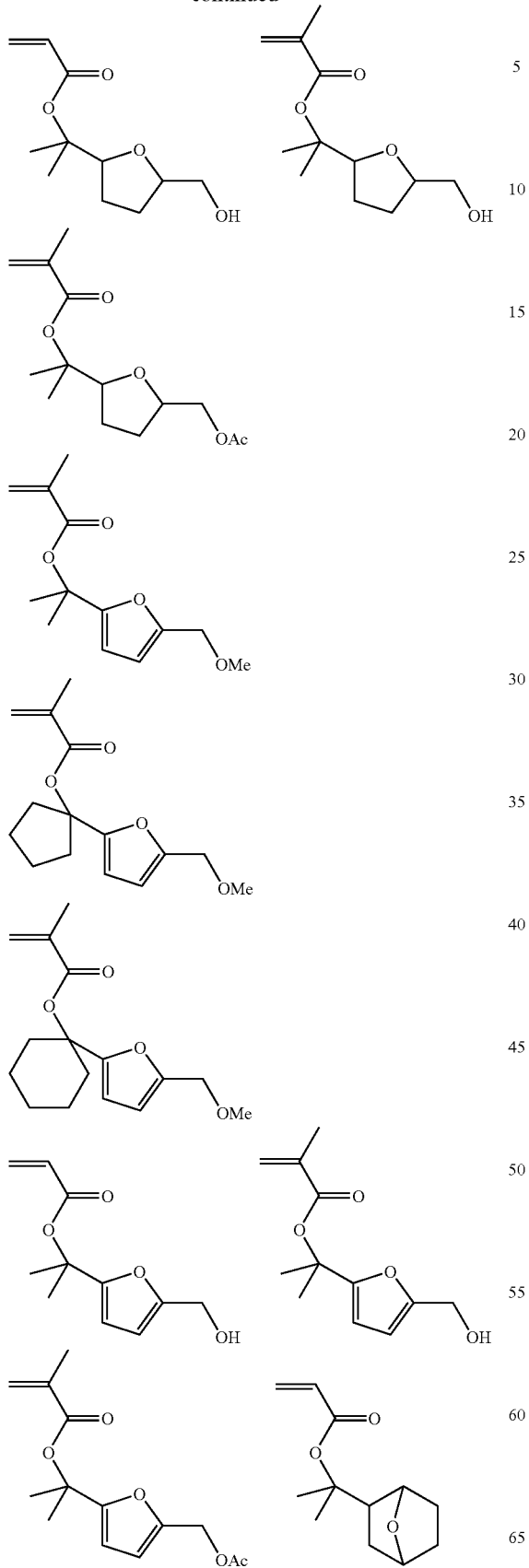

-continued

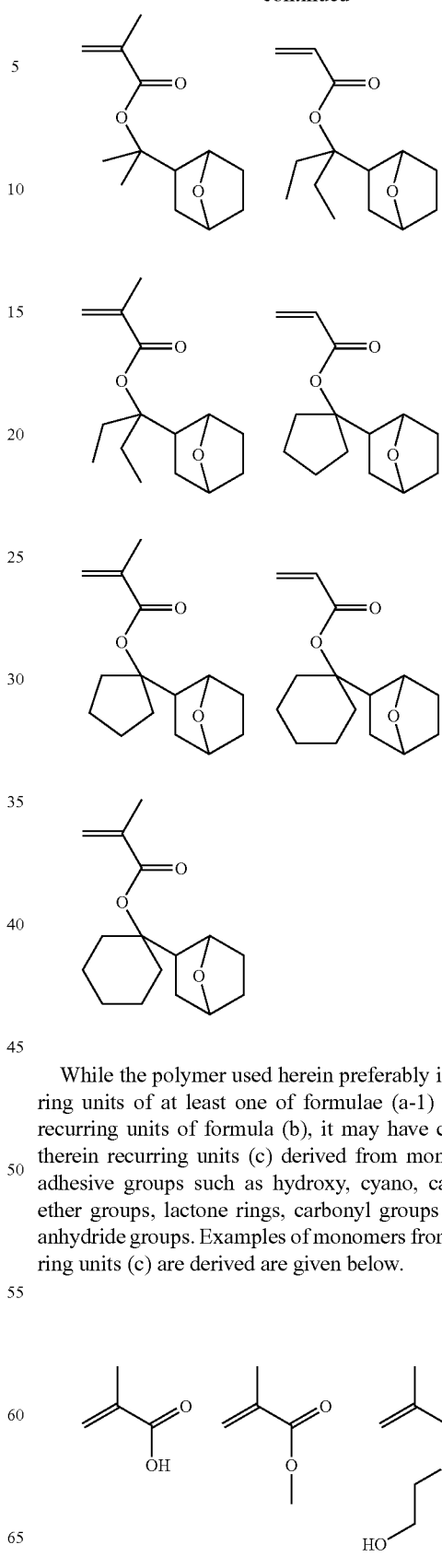

While the polymer used herein preferably includes recurring units of at least one of formulae (a-1) and (a-2) and recurring units of formula (b), it may have copolymerized therein recurring units (c) derived from monomers having adhesive groups such as hydroxy, cyano, carbonyl, ester, ether groups, lactone rings, carbonyl groups or carboxylic anhydride groups. Examples of monomers from which recurring units (c) are derived are given below.

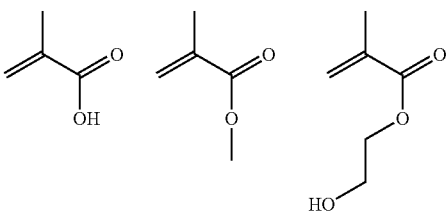

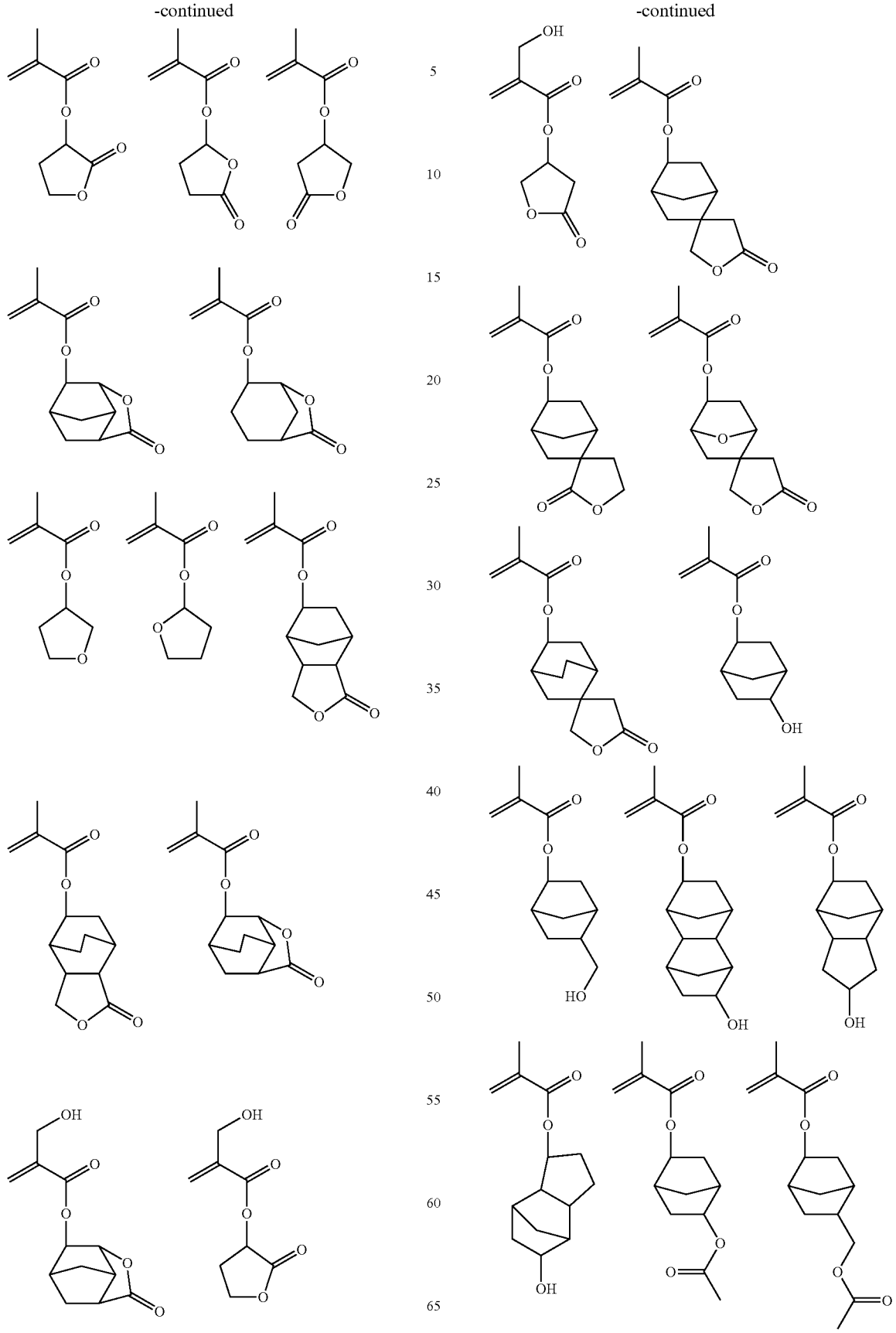

-continued
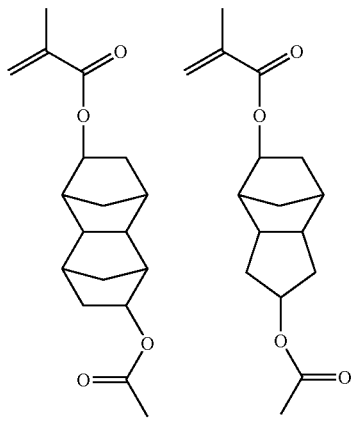
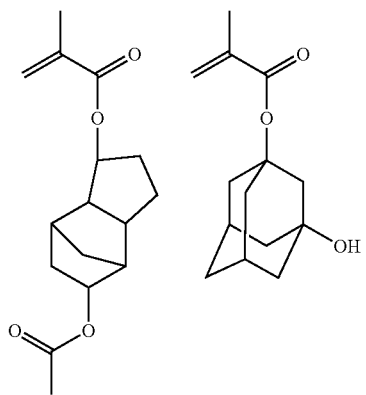
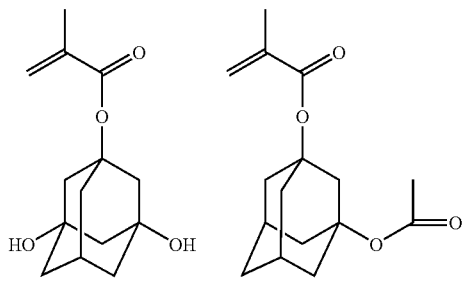
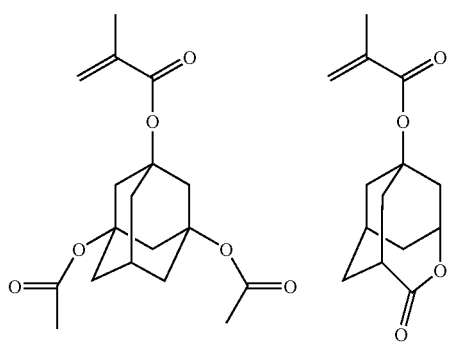
-continued
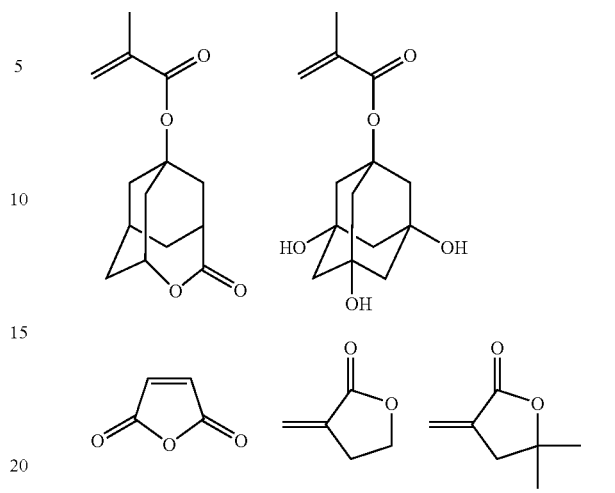
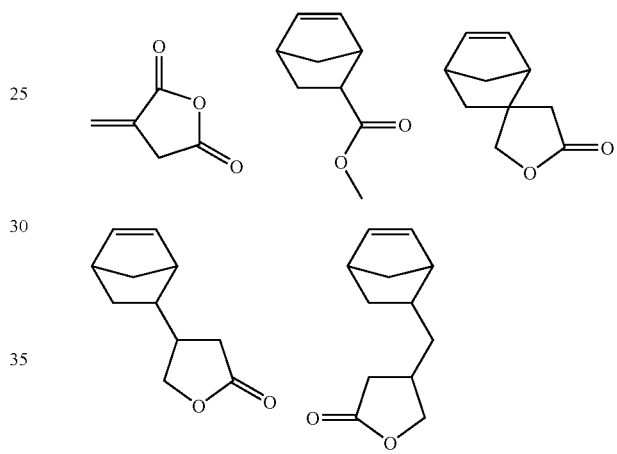
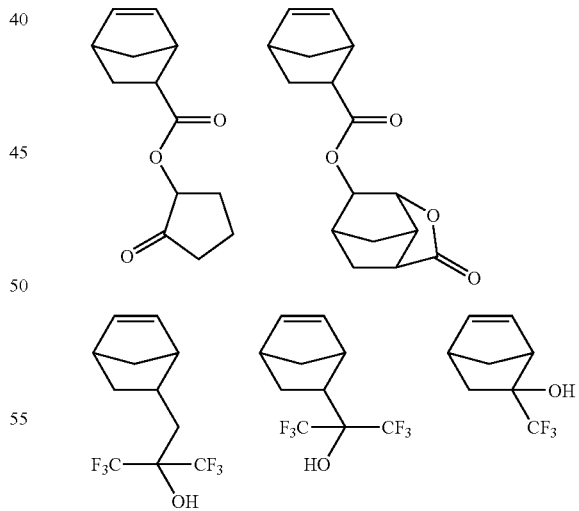
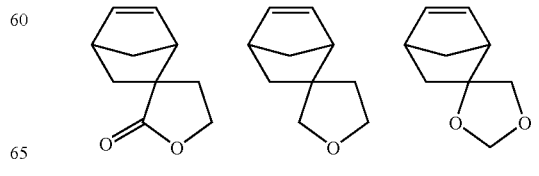

-continued
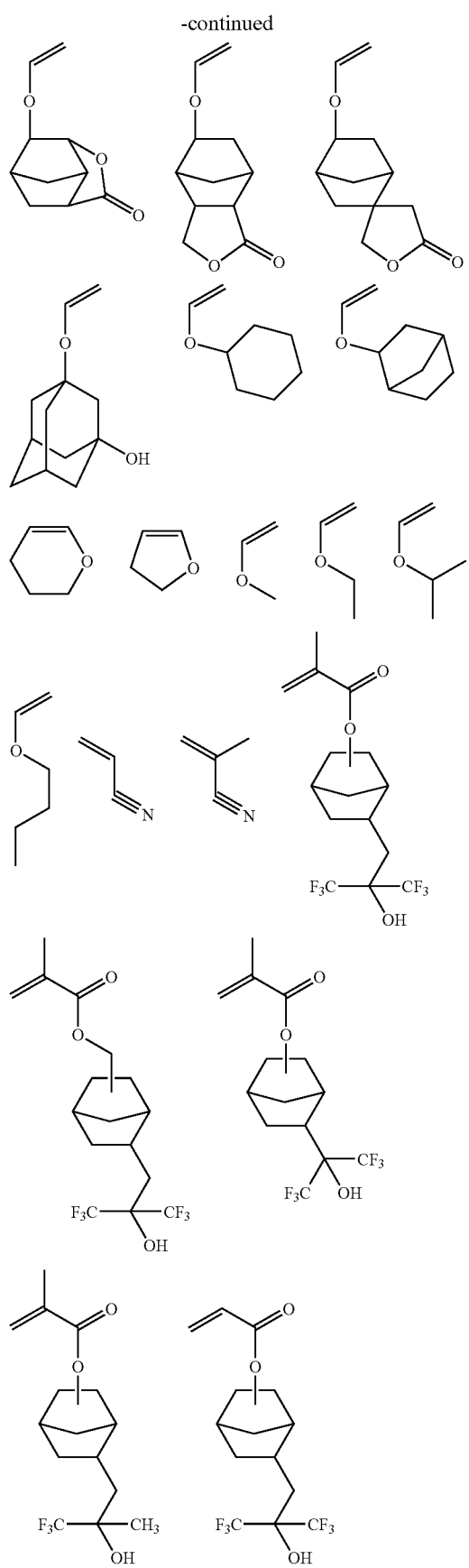
-continued
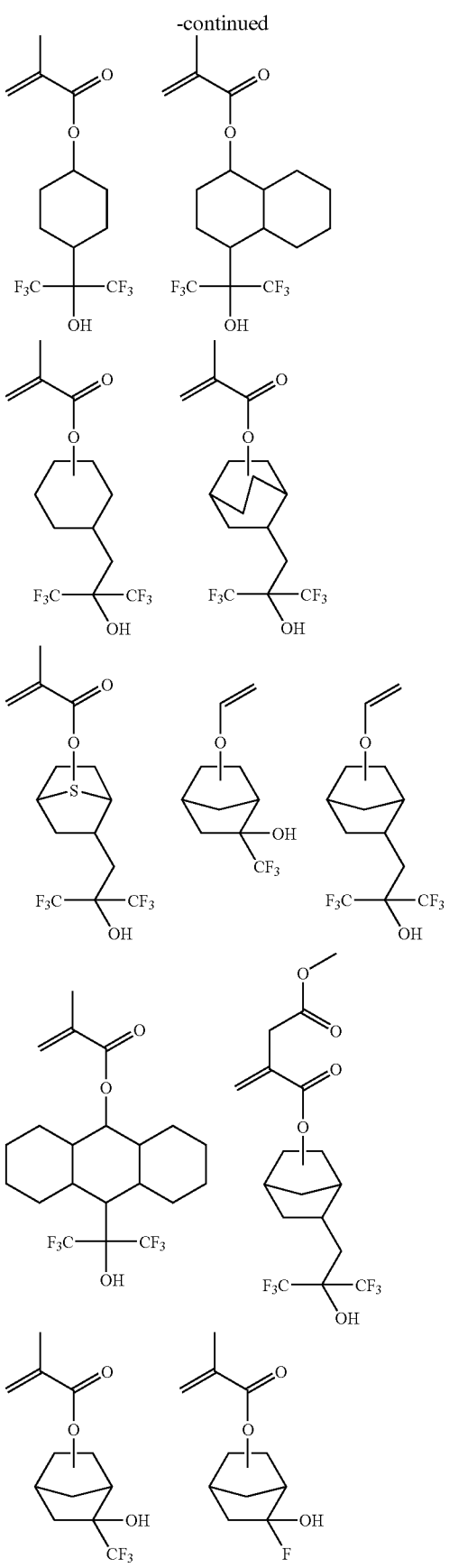

-continued
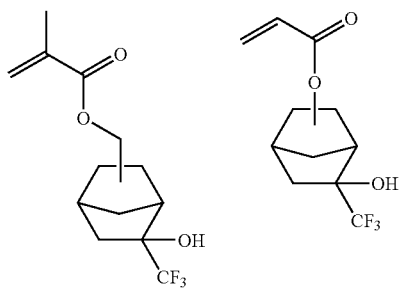
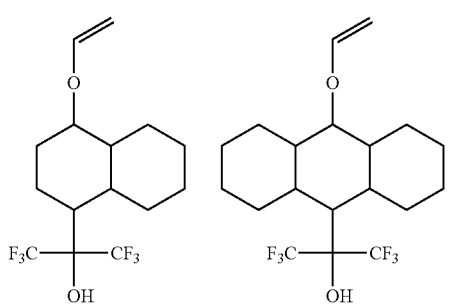
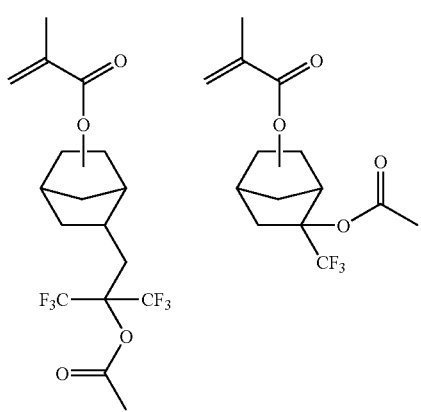
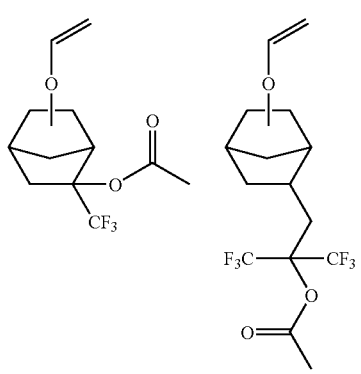
-continued
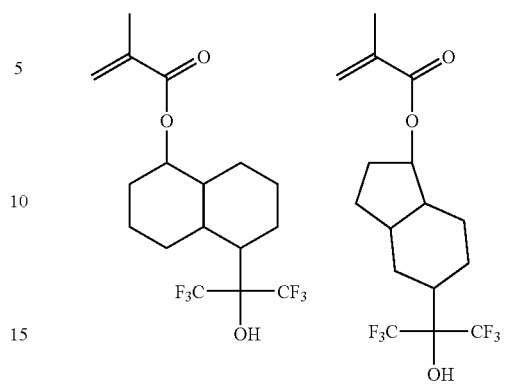
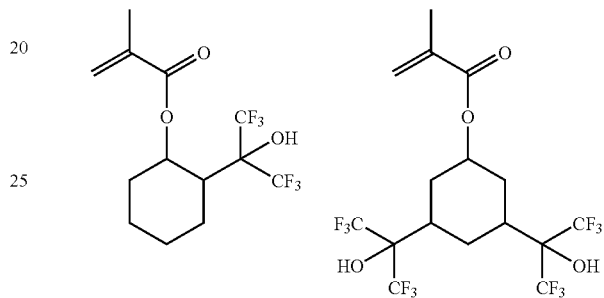
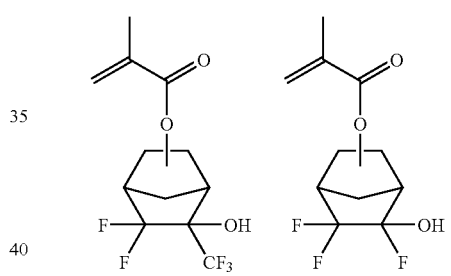
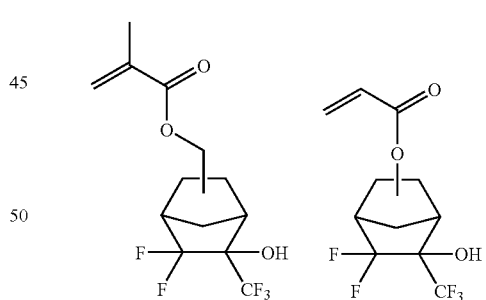
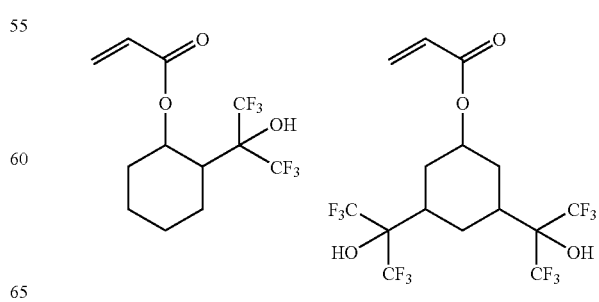

-continued
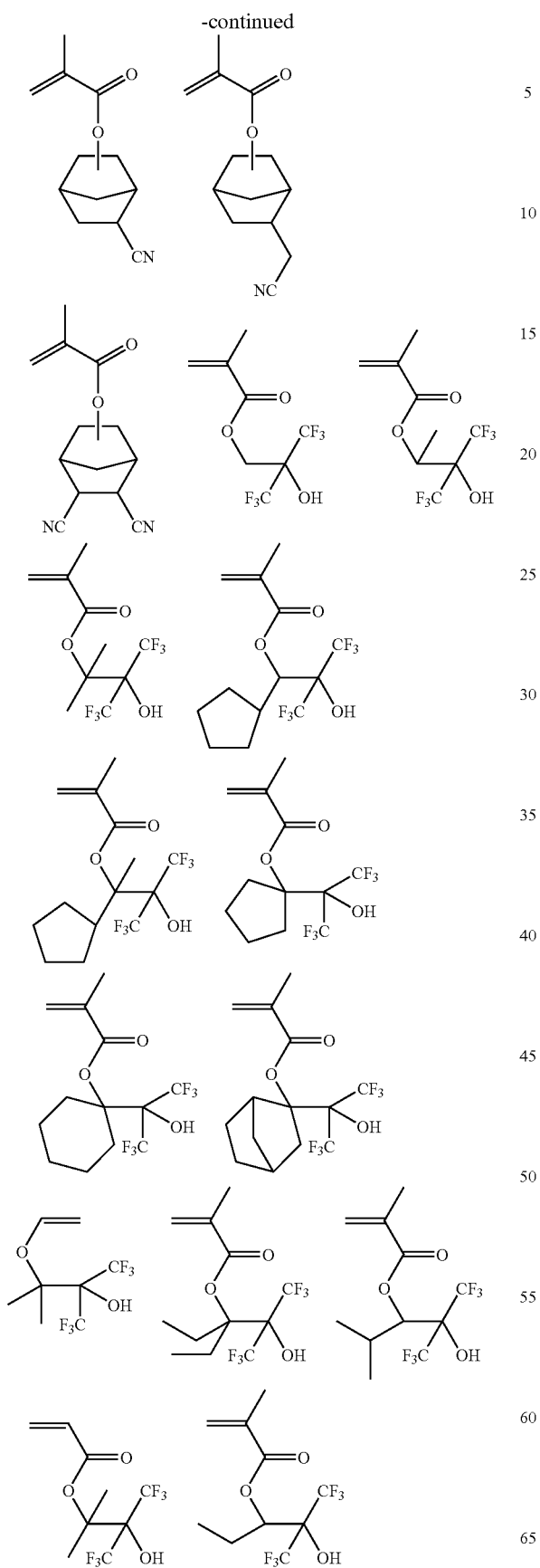
-continued
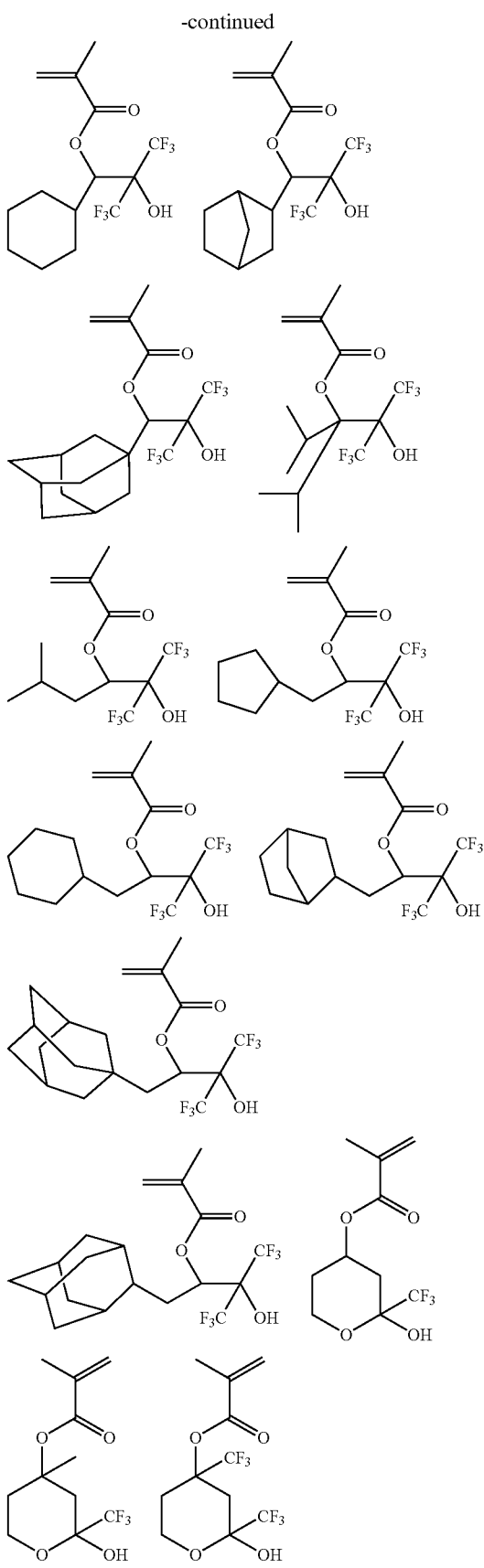

-continued
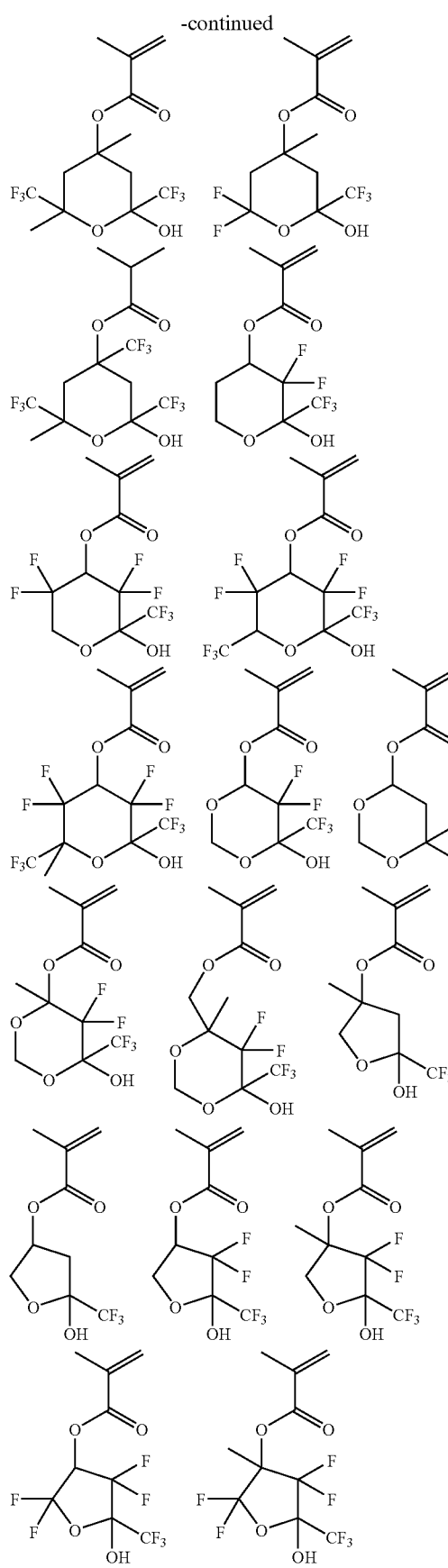
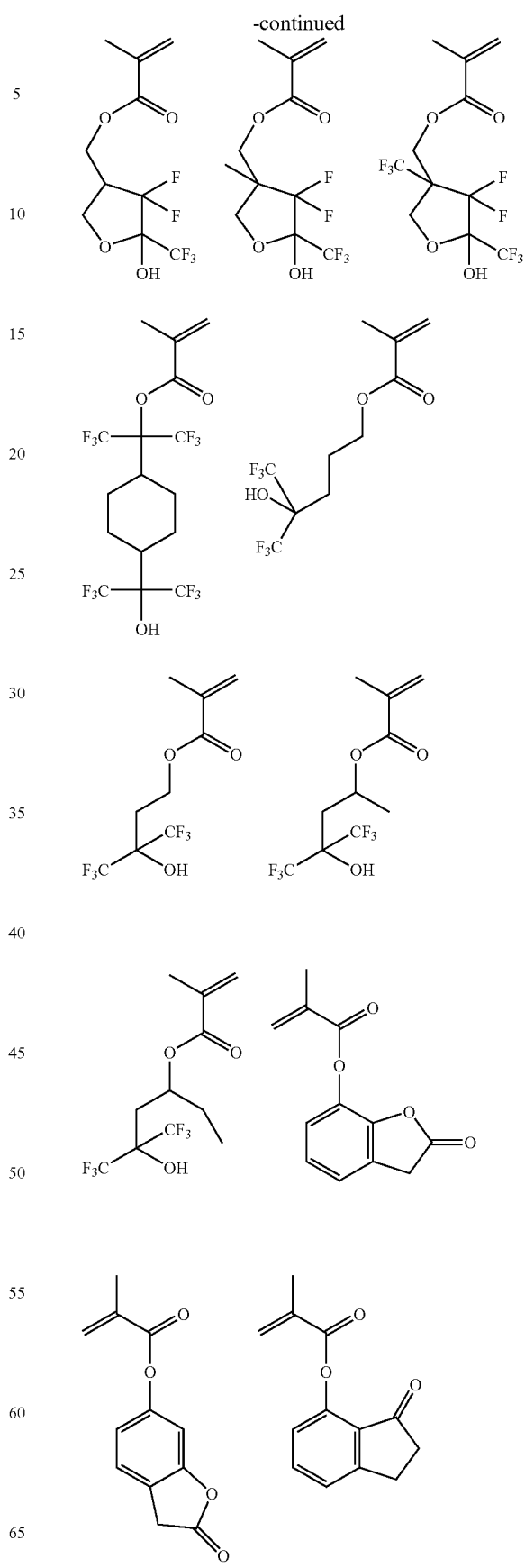

-continued

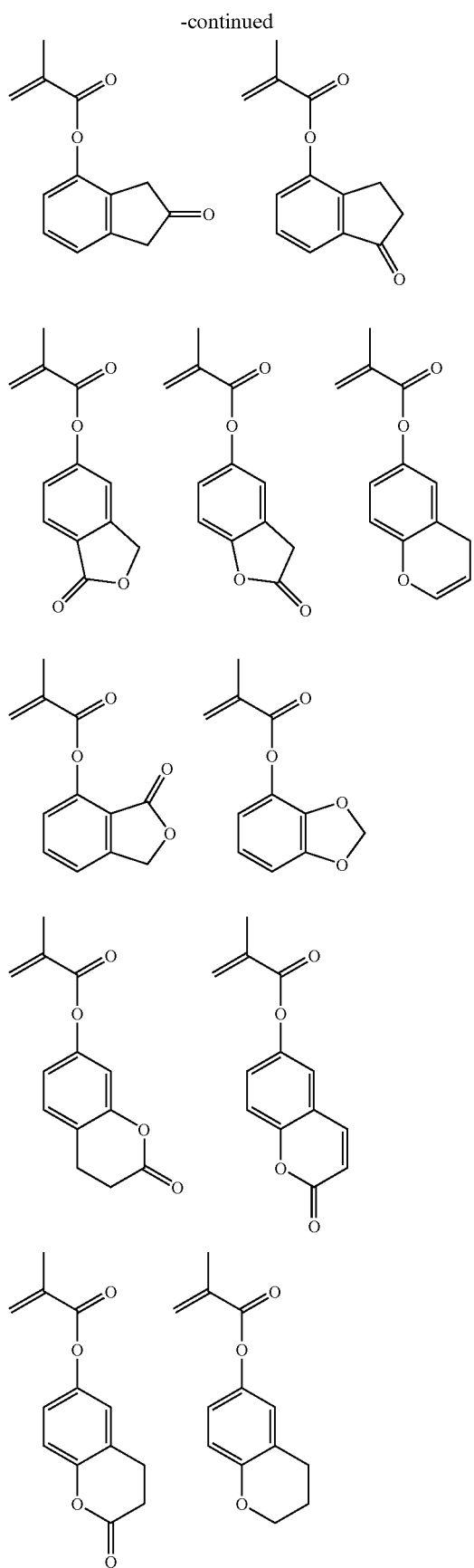
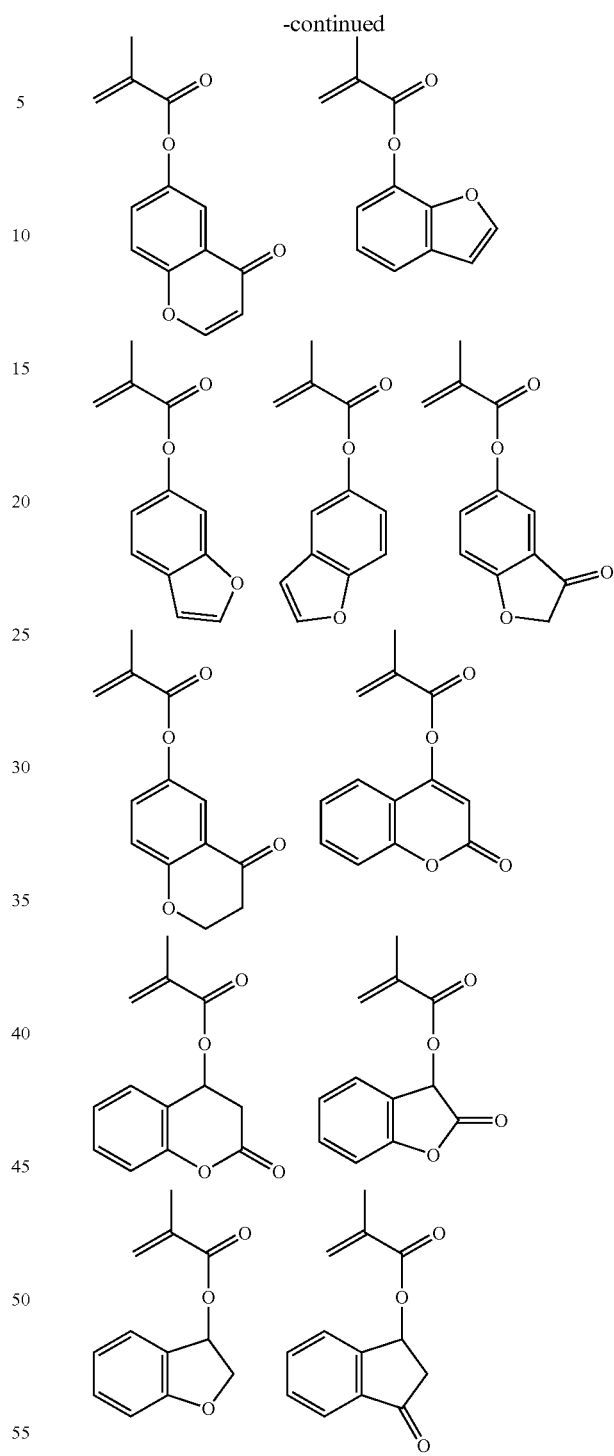

In the polymer of the invention, the recurring units (a1), (a2), (b) and (c) are present in proportions a1, a2, b, and c, respectively, which satisfy the range: $0 \leq a1 < 1.0$, $0 \leq a2 < 1.0$, $0 < a1+a2 < 1.0$, $0 < b \leq 0.8$, $0.1 \leq a1+a2+b \leq 1.0$, $0 \leq c < 1.0$, and $0.2 \leq a1+a2+b+c \leq 1.0$, preferably the range: $0 \leq a1 \leq 0.9$, $0 \leq a2 \leq 0.9$, $0.1 \leq a1+a2 \leq 0.9$, $0.1 \leq b \leq 0.7$, $0.2 \leq a1+a2+b \leq 1.0$, and $0 \leq c \leq 0.9$. It is noted that $a1+a2+b+c < 1$ means incorporation of other recurring units which include recurring units derived from one or more monomers selected from styrene, hydroxystyrene, vinylnaphthalene, hydroxyvinylnaphthalene, indene, acenaphthylene, and vinylanthracene.

The polymer serving as the base polymer in the resist used in the pattern forming process of the invention should preferably have a weight average molecular weight (Mw) in the range of 1,000 to 500,000, and more preferably 2,000 to 30,000 as measured by gel permeation chromatography (GPC) using polystyrene standards. With too low a Mw, the efficiency of thermal crosslinking in the resist material after development may become low. With too high a Mw, the polymer may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a1), (a2), (b) and (c) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. The acid labile group that has been incorporated in the monomers may be kept as such, or the acid labile group may be once removed with an acid catalyst and thereafter protected or partially protected.

Resist Composition

In addition to the polymer, the resist composition, specifically chemically amplified positive resist composition, used in the pattern forming process of the invention may comprise an organic solvent, an acid generator, and optionally, a dissolution inhibitor, a basic compound, a surfactant and other additives.

Solvent

The organic solvent used herein may be any organic solvent in which the base resin, acid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, diethylene glycol dimethyl ether, 1-ethoxy-2-propanol and propylene glycol monomethyl ether acetate, and mixtures thereof are preferred because the acid generator is most soluble therein.

The organic solvent is preferably used in an amount of about 200 to 1,000 parts by weight, more preferably about 400 to 800 parts by weight per 100 parts by weight of the base resin.

Acid Generator

The acid generators used herein include the following:

(i) onium salts of the formula (P1a-1), (P1a-2), (P1a-3) or (P1b), (ii) diazomethane derivatives of the formula (P2), (iii) glyoxime derivatives of the formula (P3), (iv) bissulfone derivatives of the formula (P4), (v) sulfonic acid esters of N-hydroxyimide compounds of the formula (P5), (vi) β-ketosulfonic acid derivatives, (vii) disulfone derivatives, (viii) nitrobenzylsulfonate derivatives, and (ix) sulfonate derivatives.

In the practice of the invention, it is preferred to use a mixture of a photoacid generator (i.e., a compound capable of generating an acid upon exposure to high-energy radiation) and a thermal acid generator (i.e., a compound capable of generating an acid upon heating, specifically heating at 150 to 400° C.) as the acid generator.

These acid generators are described in detail.

(i) Onium Salts of Formula (P1a-1), (P1a-2) and (P1a-3):

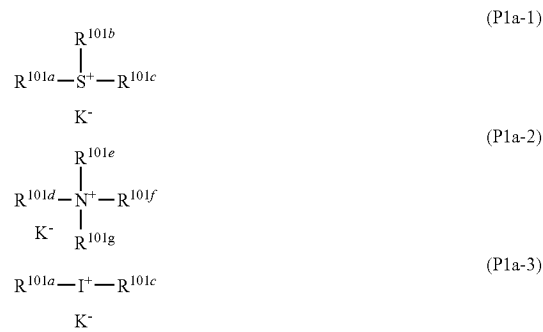

Herein, $R^{101a}$, $R^{101b}$ and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a sulfonic acid in which at least one alpha-position is fluorinated, or a perfluoroalkylimide acid or perfluoroalkylmethide acid. $R^{101a}$, $R^{101e}$, $R^{101f}$, and $R^{101g}$ stand for hydrogen atoms, straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups.

A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms or a hetero-aromatic ring having the nitrogen atom (in the formula) incorporated therein, when they form a ring.

Of the onium salts having formulae (P1a-1), (P1a-2) and (P1a-3), those of formula (P1a-1) function as a photoacid generator, those of formula (P1a-2) function as a thermal acid generator which generates acid when heated at 150 to 400° C., and those of formula (P1a-3) have both the functions of a photoacid generator and a thermal acid generator. In a system having (P1a-1) combined with (P1a-2), generator (P1-a) generates an acid upon exposure, with which pattern formation is performed, and generator (P1a-2) generates an acid when heated at high temperature after development, with which crosslinking is efficiently performed.

Examples of $K^-$ include perfluoroalkanesulfonic acids such as triflate and nonaflate; imide acids such as bis(trifluoromethylsulfonyl)imide, bis(perfluoroethylsulfonyl)imide, and bis(perfluorobutylsulfonyl)imide; methide acids such as tris(trifluoromethylsulfonyl)methide and tris(perfluoroethylsulfonyl)methide; sulfonates having fluorine substituted at α-position as represented by of the general formula (K-1) and sulfonates having fluorine substituted at α-position as represented by of the general formula (K-2).

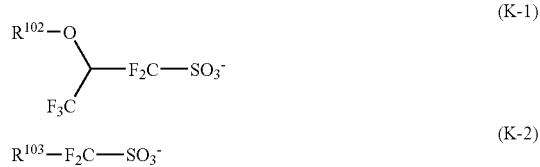

In formula (K-1), $R^{102}$ is a hydrogen atom, or a straight, branched or cyclic $C_1$-$C_{20}$ alkyl or acyl group, $C_2$-$C_{20}$ alkenyl group, or $C_6$-$C_{20}$ aryl or aryloxy group, which may have an ether group, ester group, carbonyl group or lactone ring, or in which some or all hydrogen atoms may be substituted by fluorine atoms. In formula (K-2), $R^{103}$ is a hydrogen atom, or a straight, branched or cyclic $C_1$-$C_{20}$ alkyl group, $C_2$-$C_{20}$ alkenyl group, or $C_6$-$C_{20}$ aryl group.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, 1,2,3,4,5-pentafluorobenzenesulfonate; and alkylsulfonate ions such as mesylate and butanesulfonate.

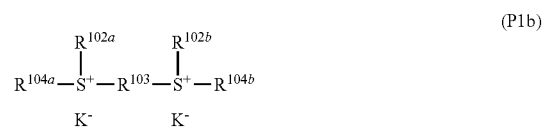

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

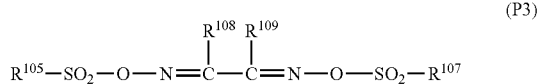

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a cyclic structure. $R^{108}$ and $R^{109}$ each are a straight or branched alkylene group of 1 to 6 carbon atoms when they form a cyclic structure. $R^{105}$ is as defined in formula (P2).

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

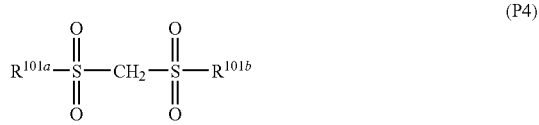

Herein, $R^{101a}$ and $R^{101b}$ are as defined above.

(v) Sulfonic Acid Esters of N-Hydroxyimide Compounds of Formula (P5)

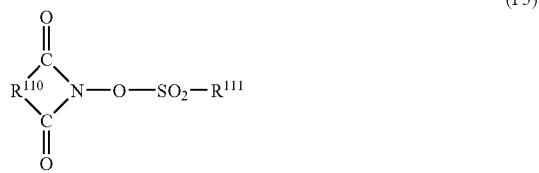

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the acid generator include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane, bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane, bispropylsulfonylmethane, bisisopropylsulfonylmethane, bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as
diphenyl disulfone derivatives and
dicyclohexyl disulfone derivatives;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxylmide methanesulfonate,
N-hydroxy-5-norbornene-2,3-dicarboxylmide trifluoromethanesulfonate, and
N-hydroxy-5-norbornene-2,3-dicarboxylmide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocylohexyl)sulfonium trifluoromethanesulfonate, and
1,2'-naphthylcarbonylmethyltetrahydrothiophenium triflate;

diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;

glyoxime derivatives such as
bis-O-(p-toluenesulfonyl)-α-dimethylglyoxime and
bis-O-(n-butanesulfonyl)-α-dimethylglyoxime;

bissulfone derivatives such as bisnaphthylsulfonylmethane;

and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

Also useful are acid generators of the oxime type described in WO 2004/074242 A2.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is preferably added in an amount of 0.1 to 50 parts, and especially 0.5 to 40 parts by weight, per 100 parts by weight of the base resin. Less than 0.1 pbw of the acid generator may generate a less amount of acid upon exposure, sometimes leading to a poor sensitivity and resolution whereas more than 50 pbw of the acid generator may adversely affect the transmittance and resolution of resist.

Where an acid generator of generating acid upon exposure and an acid generator of generating acid upon heating are used in combination, they are preferably mixed in such a proportion that the mixture consists of 1 pbw of photoacid generator and 0.001 to 1 pbw of thermal acid generator. For example, where (P1a-1) and (P1a-2) are used in combination, they are mixed such that the mixture consists of 1 pbw of (P1a-1) and 0.001 to 1 pbw of (P1a-2).

Dissolution Inhibitor

To the resist composition, a dissolution inhibitor or regulator may be added. The dissolution inhibitor is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Independent of whether or not the phenol groups are substituted with acid labile groups, the acid labile groups are deprotected by baking after development, allowing the phenol groups to contribute to an accelerated cure reaction.

Preferable examples of such compounds having two or more phenolic hydroxyl groups or compounds having at least one carboxyl group include those of formulas (D1) to (D14) below.

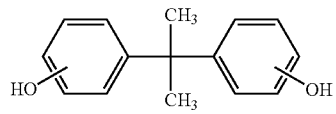
(D1)

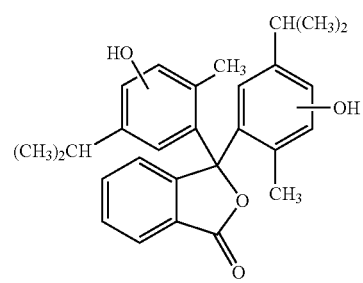
(D2)

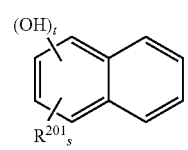
(D3)

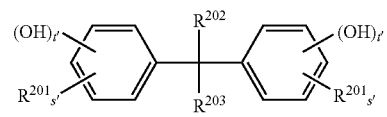
(D4)

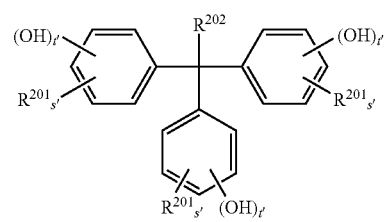
(D5)

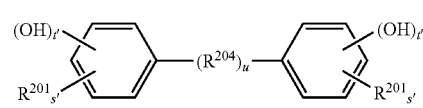
(D6)

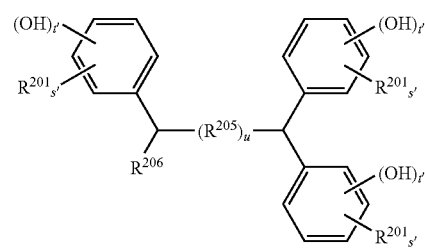
(D7)

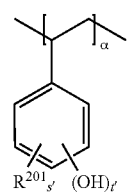
(D8)

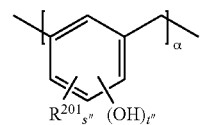
(D9)

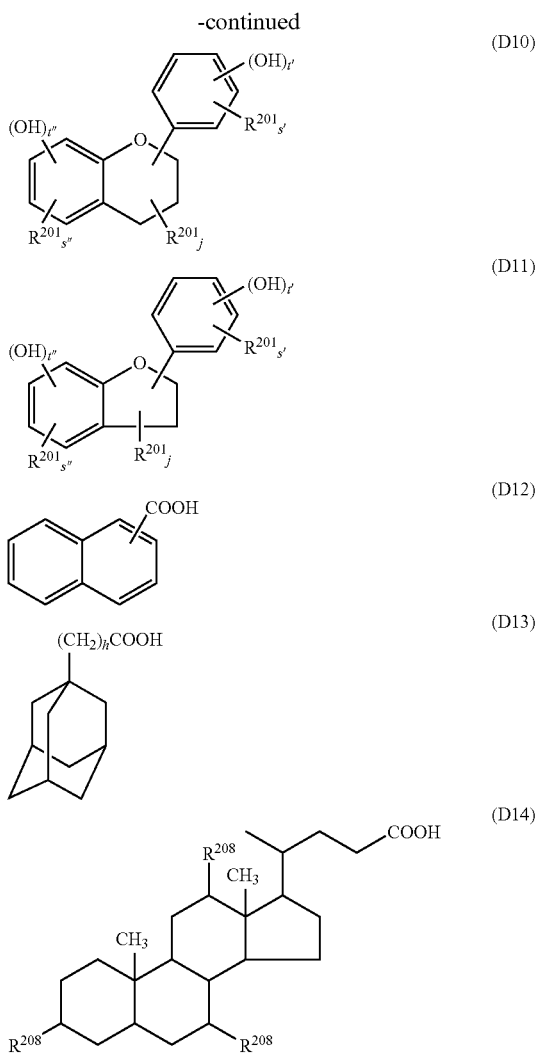

Basic Compound

The basic compound used herein is preferably a compound capable of suppressing the rate of diffusion when the acid generated by the acid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{11}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a molecular weight of from 100 to 1,000.

The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. An appropriate amount of the dissolution inhibitor is effective for improving resolution whereas more than 50 parts would lead to slimming of the patterned film, and thus a decline in resolution.

butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

$$N(X)_n(Y)_{3-n} \quad (B)\text{-}1$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring.

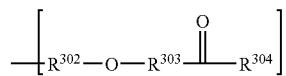

(X)-1

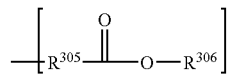

(X)-2

(X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-(2-(2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are basic compounds having cyclic structure, represented by the following general formula (B)-2.

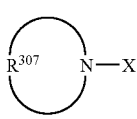  (B)-2

Herein X is as defined above, and $R^{307}$ is a straight or branched alkylene group of 2 to 20 carbon atoms which may contain one or more carbonyl, ether, ester or sulfide groups.

Illustrative examples of the compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, basic compounds having cyano group, represented by the following general formulae (B)-3 to (B)-6 are useful.

 (B)-3

 (B)-4

 (B)-5

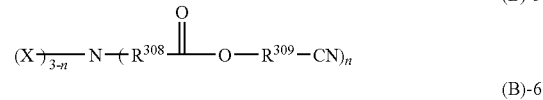 (B)-6

Herein, X, $R^{307}$ and n are as defined above, and $R^{308}$ and $R^{309}$ are each independently a straight or branched alkylene group of 1 to 4 carbon atoms.

Illustrative examples of the basic compounds having cyano group, represented by formulae (B)-3 to (B)-6, include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 part of the basic compound achieves no or little addition effect whereas more than 2 parts would result in too low a sensitivity.

Other Components

In the positive resist composition, a compound having a group =C—COOH in the molecule may be blended. Exemplary, non-limiting compounds having a carboxyl group include one or more compounds selected from Groups I and II below.

Including this compound improves the post-exposure delay (PED) stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced by —$R^{401}$—COOH (wherein $R^{401}$ is a straight or branched alkylene of 1 to 10 carbon atoms), and in which the molar ratio C/(C+D) of phenolic hydroxyl groups (C) to =C—COOH groups (D) in the molecule is from 0.1 to 1.0.

(A1)

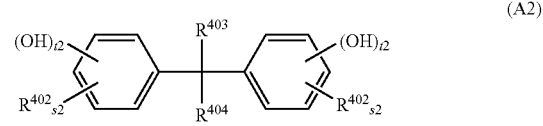
(A2)

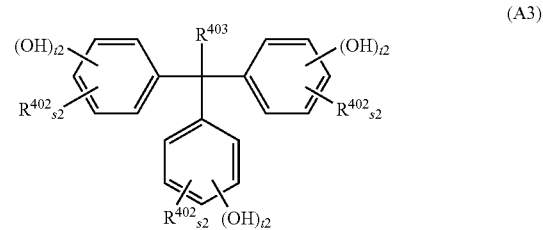
(A3)

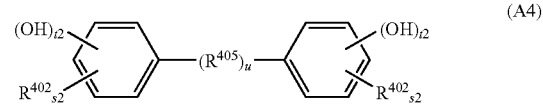
(A4)

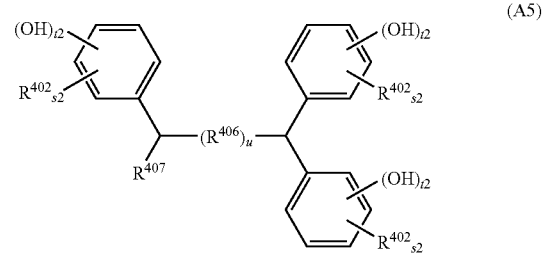
(A5)

(A6)

(A7)

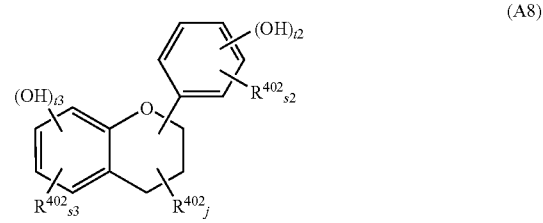
(A8)

-continued

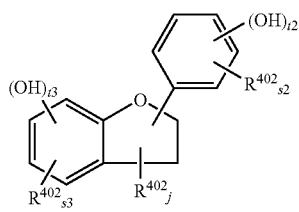
(A9)

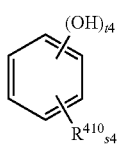
(A10)

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkyl or alkenyl or a —$R^{411}$—COOH group; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; h is an integer of 1 to 4, j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

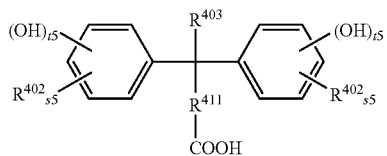
(A11)

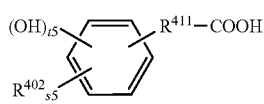
(A12)

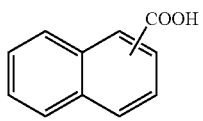
(A13)

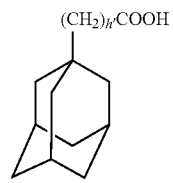
(A14)

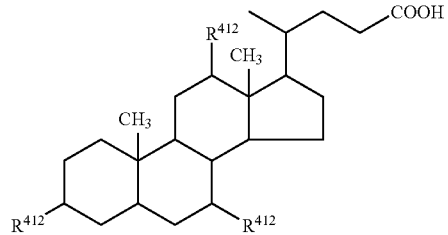
(A15)

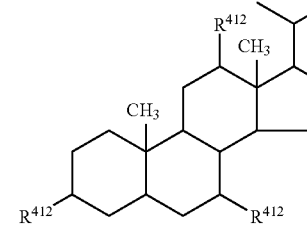

In these formulas, $R^{402}$, $R^{403}$, and $R^{411}$ are as defined above; $R^{412}$ is hydrogen or hydroxyl; s5 and t5 are numbers which satisfy s5≦0, t5≦0, and s5+t5=5; and h' is 0 or 1.

Illustrative, non-limiting examples of the compound having a carboxyl group include compounds of the general formulas AI-1 to AI-14 and AII-1 to AII-10 below.

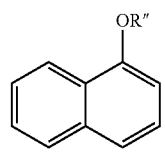
(AI-1)

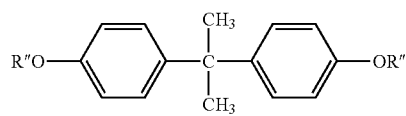
(AI-2)

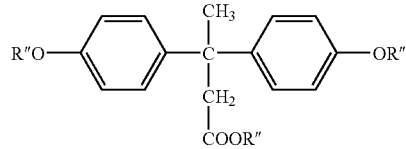
(AI-3)

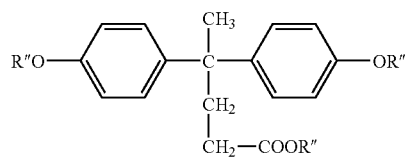
(AI-4)

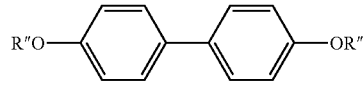
(AI-5)

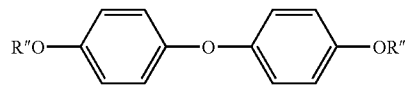
(AI-6)

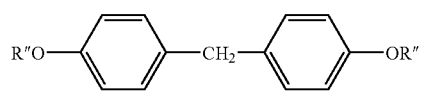
(AI-7)

In the above formulas, R″ is hydrogen or a —CH₂COOH group such that the —CH₂COOH group accounts for 10 to 100 mol % of R″ in each compound, κ and λ are as defined above.

The compound is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The positive resist composition of the invention may further include a surfactant which is commonly used for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

To the positive resist composition, the surfactant is added in an amount of up to 2 parts, preferably up to 1 part by weight, per 100 parts by weight of the base resin.

Now, the double patterning process is described.

Referring to FIG. 1, one exemplary double patterning process 1 is illustrated. A photoresist film 30 is coated and formed on a processable substrate 20 on a substrate 10. To prevent the photoresist pattern from collapsing, the technology intends to reduce the thickness of photoresist film. One approach taken to compensate for a lowering of etch resistance of thinner film is to process the processable substrate using a hard mask. The double patterning process illustrated in FIG. 1 uses a multilayer coating in which a hard mask 40 is laid between the photoresist film 30 and the processable substrate 20 as shown in FIG. 1-A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON or p-Si, for example. The resist material used in double patterning process 1 is a positive resist composition. In the process, the resist film 30 is exposed and developed (FIG. 1-B), the hard mask 40 is then dry etched (FIG. 1-C), the photoresist film is stripped, and a second photoresist film 50 is coated, formed, exposed, and developed (FIG. 1-D). Then the processable substrate 20 is dry etched (FIG. 1-E). Since this etching is performed using the hard mask pattern and the second photoresist pattern as a mask, variations occur in the pattern size after etching of the processable substrate due to a difference in etch resistance between hard mask 40 and photoresist film 50.

To solve the above problem, a double patterning process 2 illustrated in FIG. 2 involves laying two layers of hard mask 41 and 42. The upper layer of hard mask 42 is processed using a first resist pattern, the lower layer of hard mask 41 is processed using a second resist pattern, and the processable substrate is dry etched using the two hard mask patterns. It is essential to establish a high etching selectivity between first hard mask 41 and second hard mask 42. Thus the process is rather complex.

FIG. 3 illustrates a double patterning process 3 using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELAX method, but this process is more intricate. Using negative resist materials enables exposure at a high optical contrast, but the negative resist materials generally have the drawbacks of low contrast and low resolution capability as compared with positive resist materials.

The double patterning processes 1 to 3 described above have the drawback that two hard mask etchings are involved.

Figure 4B:
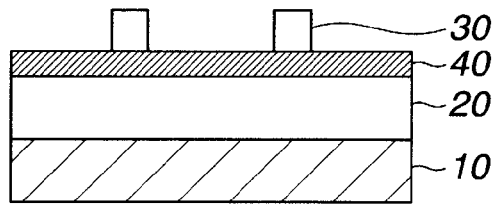
Figure 4C:
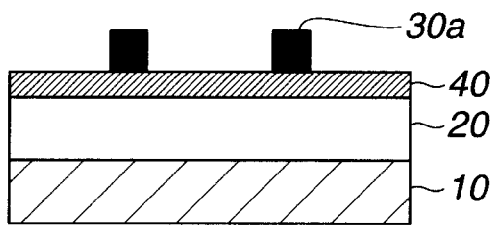
Figure 4D:
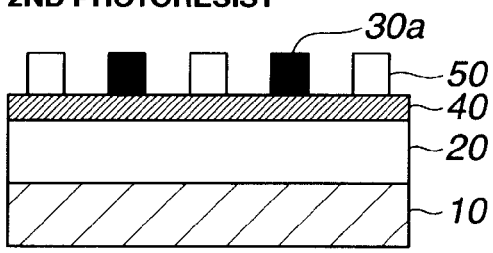
Figure 4E:
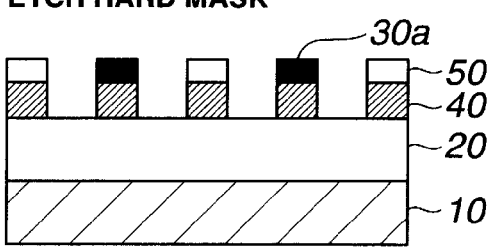
Figure 4F:
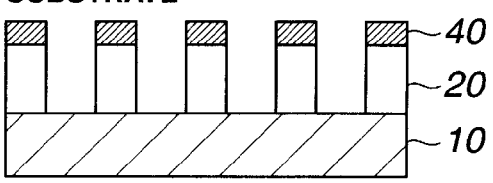

FIG. 4 illustrates a double patterning process of the invention. As in FIG. 1-A, a photoresist film 30 of positive resist material is formed on a processable substrate 20 on a substrate 10 via a hard mask 40 (FIG. 4-A). The resist film 30 is then exposed and developed (FIG. 4-B). Then the resist film 30 is crosslinked and cured with the aid of acid and heat, forming a crosslinked resist film 30a (FIG. 4-C). Further, a second resist material is coated thereon to form a resist film 50, which is exposed and developed to form a pattern of second photoresist film 50 in the space area of the pattern of resist film 30, i.e., crosslinked resist film 30a (FIG. 4-D). Then the hard mask 40 is etched (FIG. 4-E). The processable substrate 20 is dry etched, and finally, the crosslinked resist film 30a and second resist film 50 are removed (FIG. 4-F).

The substrate 10 used herein is generally a silicon substrate. The processable substrate 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask 40 is as described above.

In the process of the invention, a resist film of positive resist material is formed on the processable substrate directly or via the intermediate intervening layer. The resist film preferably has a thickness of 10 to 1,000 nm, and more preferably 20 to 500 nm. The resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any dissolution from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/cm$^2$, more preferably about 10 to 100 mJ/cm$^2$. This is followed by baking on a hot plate at 60 to 150° C. for 1 to 5 minutes, preferably at 80 to 120° C. for 1 to 3 minutes (post-exposure baking=PEB).

Thereafter the resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate.

The resist pattern as developed is then cured with the aid of acid and/or heat, and preferably crosslinked with the aid of acid and heat. The acid is generated by subjecting the wafer as developed to flood exposure to decompose the photoacid generator. The flood exposure conditions include an exposure wavelength of 180 to 300 nm and an exposure dose of 10 mJ/cm$^2$ to 10 J/cm$^2$. The light sources used for flood exposure include low-pressure mercury lamps emitting light at wavelength 254 nm and 185 nm, KrF excimer laser of wavelength 248 nm, KrCl excimer lamp of wavelength 222 nm, and ArF excimer laser of wavelength 193 nm. Irradiation from excimer laser or excimer lamp not only causes the photoacid generator to generate an acid, but also promotes photo-induced crosslinking reaction. When a thermal acid generator in the form of an ammonium salt is added to a photoresist composition, an acid can be generated by heating. In this case, acid generation and crosslinking reaction proceed simultaneously. The preferred heating conditions include a temperature of 150 to 400° C., and especially 160 to 300° C., and a time of 10 to 500 seconds. As a result, a crosslinked film is formed which is insoluble in solvents and alkaline developers. Baking may be effected in multiple stages. The progress of crosslinking may be controlled by multiple stages of baking, for example, a first stage of baking at 160° C. and a second stage of baking at 200° C.

Next, a resist material is coated onto the intermediate intervening layer of hard mask or the like having the pattern of crosslinked resist film formed thereon, thereby forming a second resist film. The resist material used at this point is preferably a positive resist composition, and more preferably a chemically amplified positive resist composition. The resist material used at this point may be the same as the resist composition disclosed herein or any of well-known resist compositions. The pattern forming process of the invention is characterized by the acid and/or heat-induced crosslinking reaction of the first resist pattern after development, while the crosslinking reaction of the second resist pattern after development is not necessary. Namely, the 7-oxanorbornane ring of formula (1) is not essential for the resist material for forming the second resist pattern.

Preferably the second resist film is exposed and developed in a conventional way to form a pattern of second resist film in the space area of the above-described pattern of crosslinked resist film, for thereby reducing the distance between patterns to one half. The conditions of exposure and development may be the same as the previous conditions.

Next, using the crosslinked resist film and second resist film as a mask, the intermediate intervening layer of hard mask or the like is etched, and the processable substrate further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film and second resist film are removed. Removal of these films may be carried out after etching of the intermediate intervening layer of hard mask or the like. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or dispersity, NMR for nuclear magnetic resonance, and LER for line edge roughness. For all polymers, Mw and Mn are determined by GPC versus polystyrene standards.

Synthesis Examples

Polymers to be used in resist compositions were prepared by combining various monomers, effecting copolymerization reaction in tetrahydrofuran medium, crystallization in methanol, repeatedly washing with hexane, isolation, and drying. The resulting polymers (Polymers 1 to 10, Comparative Polymers 1 to 3) had the composition shown below. The composition of each polymer was analyzed by $^1$H-NMR, and the Mw and Mw/Mn determined by GPC.

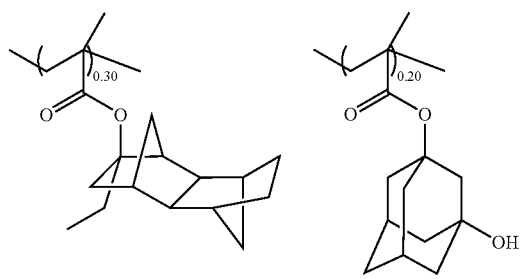

Polymer 1

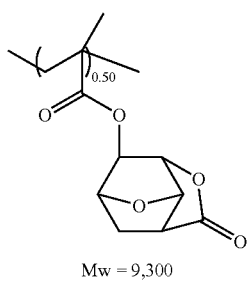
Mw = 9,300
Mw/Mn = 1.88
Polymer 2
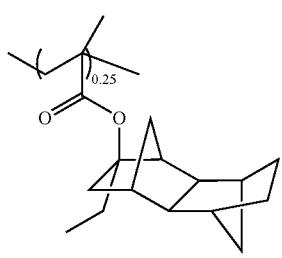
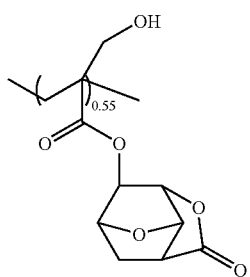
Mw = 8,200
Mw/Mn = 1.79
Polymer 3
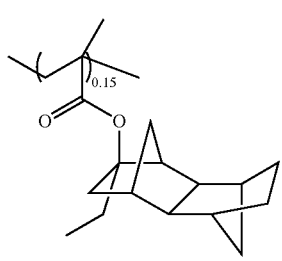
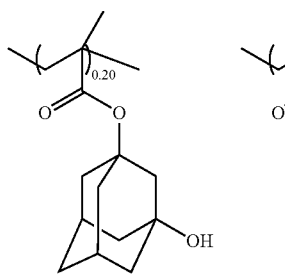
Mw = 8,600
Mw/Mn = 1.82
Polymer 4
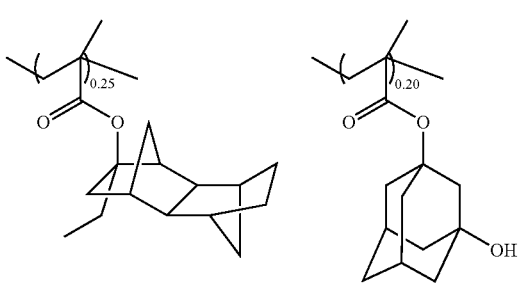
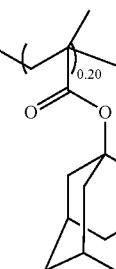
Mw = 11,000
Mw/Mn = 1.88
Polymer 5
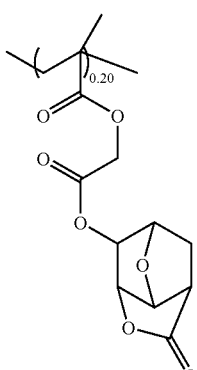
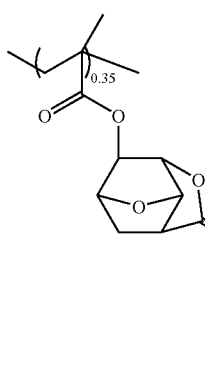
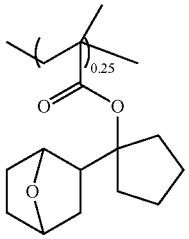
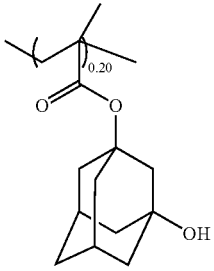
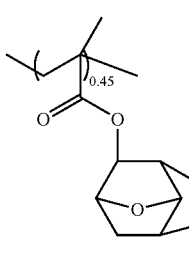
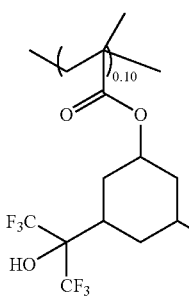
Mw = 6,900
Mw/Mn = 1.74

Polymer 6
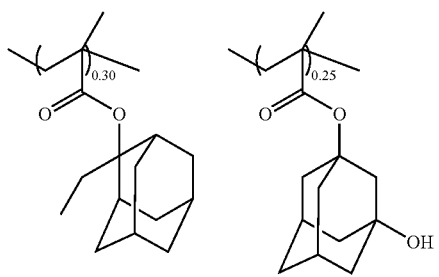
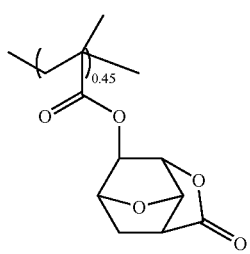
Mw = 7,600
Mw/Mn = 1.79
Polymer 7
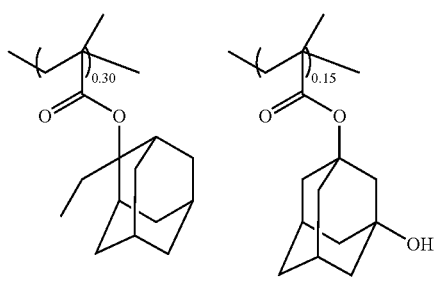
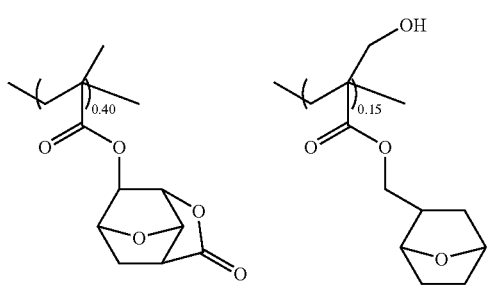
Mw = 9,300
Mw/Mn = 1.79
Polymer 8
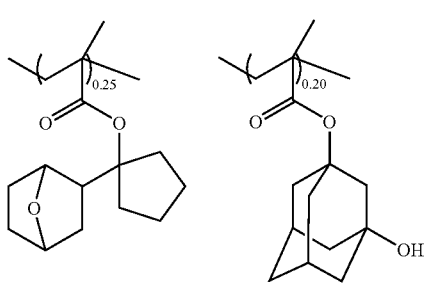
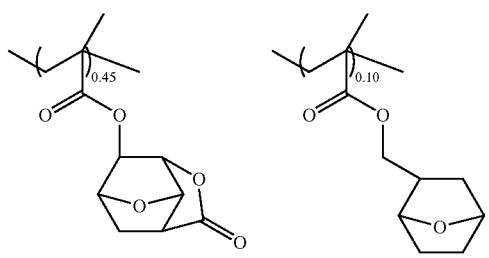
Mw = 6,900
Mw/Mn = 1.74
Polymer 9
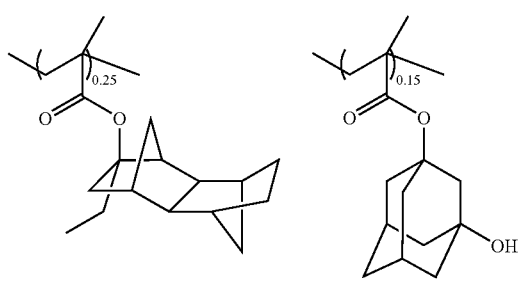
Mw = 7,900
Mw/Mn = 1.68
Polymer 10
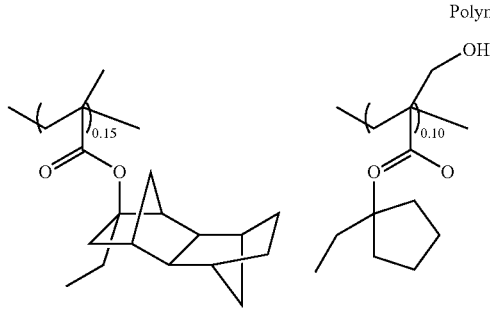
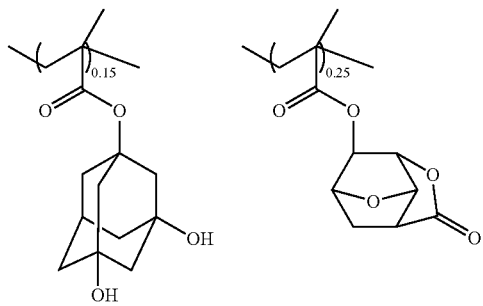

-continued

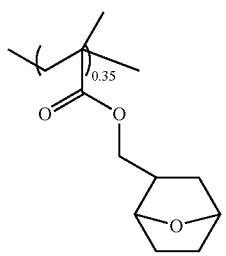

Mw = 9,300
Mw/Mn = 1.98

Comparative Polymer 1

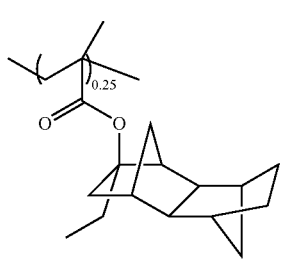 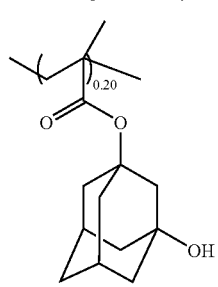

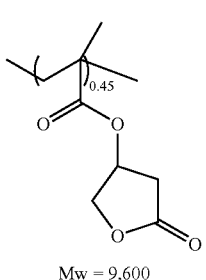

Mw = 7,900
Mw/Mn = 1.72

Comparative Polymer 2

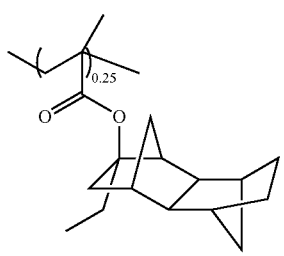 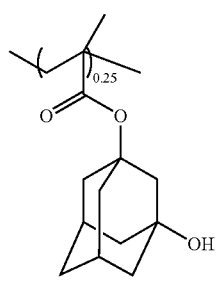

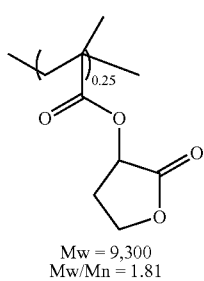

Mw = 9,300
Mw/Mn = 1.81

-continued

Comparative Polymer 3

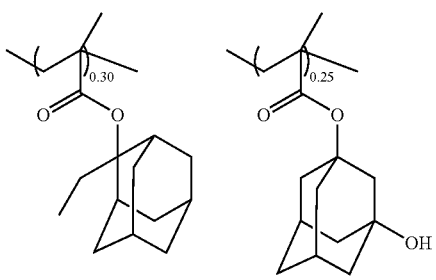

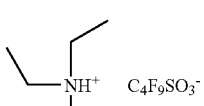

Mw = 9,600
Mw/Mn = 1.89

Examples 1 to 12 and Comparative Examples 1 to 5

Polymer Crosslinking Test

The above-synthesized polymers (Polymers 1 to 10, Comparative Polymers 1 to 3) were examined for thermal crosslinking with the aid of an acid catalyst. A solution was prepared by mixing each polymer, a thermal acid generator and a solvent in accordance with the recipe shown in Table 1, and filtering through a Teflons filter with a pore size of 0.2 μm.

The components in Table 1 are identified below.

Thermal acid generators: TAG1 to 3 of the following structural formulae

TAG 1

TAG 2

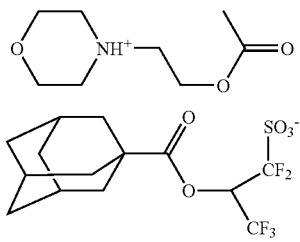

-continued

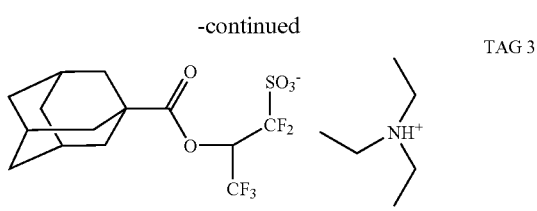
TAG 3

Organic solvent: propylene glycol monomethyl ether acetate (PGMEA)

Each polymer solution was coated onto a 8-inch silicon substrate, baked at 100° C. for 60 seconds and then at 200° C. for 60 seconds to form a polymer film, which was measured for thickness by an optical film thickness gauge. On the polymer film, a solvent mixture of PGMEA and cyclohexanone in a weight ratio of 70/30 was dispensed for 20 seconds, spin dried at 2,000 rpm for 30 seconds, and dried at 100° C. for 60 seconds. The film thickness was measured again, from which a difference in film thickness before and after solvent application was computed. Note that in Comparative Example 5, the polymer solution was coated and baked at 140° C. for 60 seconds. The results are also shown in Table 1.

It is seen from the data in Table 1 that when compositions comprising a base polymer having 7-oxanorbornane structure and a thermal acid generator are coated and baked at 200° C., the resulting films are rendered insoluble in solvents. This proves a progress of crosslinking.

Examples 13 to 26 and Comparative Examples 6 to 8

Preparation of Positive Resist Composition

A resist solution was prepared by dissolving each of the above-synthesized polymers (Polymers 1 to 10, Comparative Polymers 1 to 3) and other components in a solvent in accordance with the recipe shown in Table 2, and filtering through a Teflon® filter with a pore size of 0.2 μm.

The components in Table 2 are identified below.

TABLE 1

Curing test

|   |   | Polymer (pbw) | TAG (pbw) | Organic solvent (pbw) | Film thickness reduction after solvent application (nm) |
|---|---|---|---|---|---|
| Example | 1 | Polymer 1 (100) | TAG1 (4.0) | PGMEA (800) | 2.2 |
|  | 2 | Polymer 2 (100) | TAG1 (4.0) | PGMEA (800) | 0.8 |
|  | 3 | Polymer 3 (100) | TAG1 (4.0) | PGMEA (800) | 2.2 |
|  | 4 | Polymer 4 (100) | TAG1 (4.0) | PGMEA (800) | 3.0 |
|  | 5 | Polymer 5 (100) | TAG1 (4.0) | PGMEA (800) | 3.8 |
|  | 6 | Polymer 6 (100) | TAG1 (4.0) | PGMEA (800) | 4.3 |
|  | 7 | Polymer 7 (100) | TAG1 (4.0) | PGMEA (800) | 2.1 |
|  | 8 | Polymer 8 (100) | TAG1 (4.0) | PGMEA (800) | 1.0 |
|  | 9 | Polymer 9 (100) | TAG1 (4.0) | PGMEA (800) | 2.0 |
|  | 10 | Polymer 10 (100) | TAG1 (4.0) | PGMEA (800) | 0.2 |
|  | 11 | Polymer 9 (100) | TAG2 (4.0) | PGMEA (800) | 2.0 |
|  | 12 | Polymer 9 (100) | TAG3 (4.0) | PGMEA (800) | 2.0 |
| Comparative Example | 1 | Comparative Polymer 1 (100) | TAG1 (4.0) | PGMEA (800) | 50 |
|  | 2 | Comparative Polymer 2 (100) | TAG1 (4.0) | PGMEA (800) | 65 |
|  | 3 | Comparative Polymer 3 (100) | TAG1 (4.0) | PGMEA (800) | 162 |
|  | 4 | Polymer 1 (100) | — | PGMEA (800) | 390 |
|  | 5 | Polymer 1 (100) | TAG1 (4.0) | PGMEA (800) | >400 |

Acid generator: PAG1 of the following structural formula

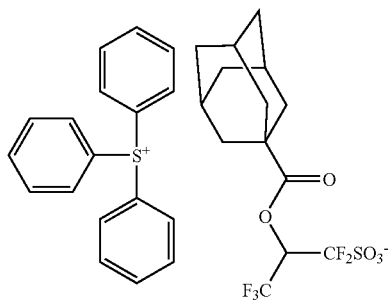

PAG1

Basic compound: Quencher 1 of the following structural formula

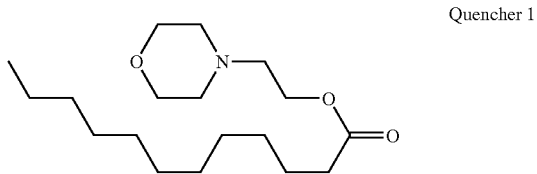

Quencher 1

Dissolution inhibitor: DRI1 of the following structural formula

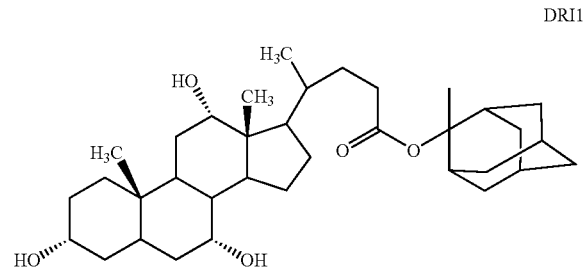

DRI1

Organic solvent: PGMEA

ArF Exposure/Patterning Test

On a substrate having an antireflective coating (ARC-29A, Nissan Chemical Industries, Ltd.) of 80 nm thick, a resist solution prepared in accordance with the recipe of Table 2 was spin coated, then baked on a hot plate at 110° C. for 60 seconds to give a resist film having a thickness of 120 nm.

The resist film was exposed by means of an ArF excimer laser scanner model NSR-S307E (Nikon Corp., NA 0.85, σ 0.93/0.70, 20° dipole illumination, 6% halftone phase shift mask). Immediately after exposure, the resist film was baked (PEB) at 100° C. for 60 seconds and then developed for 30 seconds with a 2.38% aqueous solution of tetramethylammonium hydroxide, obtaining a positive pattern.

The resist pattern was evaluated. The sensitivity of the resist was the exposure dose (mJ/cm$^2$) which provided a 1:1 resolution to a 65-nm line-and-space pattern. Using a measuring SEM model S-9380 (Hitachi Ltd.), the edge roughness of 65-nm line at this exposure dose was measured.

Next, the coated wafers in Examples 13 to 19, 21 to 24 and Comparative Examples 6 to 8 were exposed over their entire surface to ArF excimer laser in a dose of 50 mJ/cm$^2$ and then heated on a hot plate at 200° C. for 60 seconds for crosslinking reaction. The coated wafers in Examples 20, 25 and 26 were similarly heated without ArF excimer laser exposure. Using a measuring SEM model S-9380 (Hitachi Ltd.), the edge roughness of 65-nm line was measured. The results are shown in Table 2.

TABLE 2

|  |  | Polymer (pbw) | Acid generator (pbw) | Basic compound (pbw) | Dissolution inhibitor (pbw) | Organic solvent (pbw) | Sensitivity (mJ/cm$^2$) | LER after development (3σ, nm) | LER after heating (3σ, nm) |
|---|---|---|---|---|---|---|---|---|---|
| Example | 13 | Polymer 1 (100) | PAG1 (14.0) | Quencher 1 (1.20) | — | PGMEA (2,000) | 29 | 7.2 | 5.0 |
|  | 14 | Polymer 2 (100) | PAG1 (14.0) | Quencher 1 (1.20) | — | PGMEA (2,000) | 36 | 6.5 | 5.9 |
|  | 15 | Polymer 3 (100) | PAG1 (14.0) | Quencher 1 (1.20) | — | PGMEA (2,000) | 38 | 6.9 | 5.7 |
|  | 16 | Polymer 4 (100) | PAG1 (14.0) | Quencher 1 (1.20) | — | PGMEA (2,000) | 28 | 6.9 | 4.1 |
|  | 17 | Polymer 5 (100) | PAG1 (14.0) | Quencher 1 (1.20) | — | PGMEA (2,000) | 22 | 5.0 | 3.7 |
|  | 18 | Polymer 6 (100) | PAG1 (14.0) | Quencher 1 (1.20) | — | PGMEA (2,000) | 26 | 6.2 | 4.7 |
|  | 19 | Polymer 7 (100) | PAG1 (14.0) | Quencher 1 (1.20) | — | PGMEA (2,000) | 35 | 7.5 | 6.4 |
|  | 20 | Polymer 2 (100) | PAG1 (14.0) TAG1 (2.0) | Quencher 1 (1.20) | — | PGMEA (2,000) | 32 | 6.4 | 5.2 |
|  | 21 | Polymer 2 (100) | PAG1 (14.0) | Quencher 1 (1.20) | DRI1 (10) | PGMEA (2,000) | 31 | 6.7 | 4.9 |
|  | 22 | Polymer 8 (100) | PAG1 (14.0) | Quencher 1 (1.20) | — | PGMEA (2,000) | 33 | 5.5 | 5.1 |

TABLE 2-continued

|  |  | Polymer (pbw) | Acid generator (pbw) | Basic compound (pbw) | Dissolution inhibitor (pbw) | Organic solvent (pbw) | Sensitivity (mJ/cm$^2$) | LER after development (3σ, nm) | LER after heating (3σ, nm) |
| --- | --- | --- | --- | --- | --- | --- | --- | --- | --- |
|  | 23 | Polymer 9 (100) | PAG1 (14.0) | Quencher 1 (1.20) | — | PGMEA (2,000) | 26 | 7.1 | 5.8 |
|  | 24 | Polymer 10 (100) | PAG1 (14.0) | Quencher 1 (1.20) | — | PGMEA (2,000) | 37 | 7.9 | 6.6 |
|  | 25 | Polymer 10 (100) | PAG1 (14.0) TAG2 (2.0) | Quencher 1 (1.20) | — | PGMEA (2,000) | 31 | 7.5 | 6.1 |
|  | 26 | Polymer 10 (100) | PAG1 (14.0) TAG3 (2.0) | Quencher 1 (1.20) | — | PGMEA (2,000) | 32 | 7.7 | 6.0 |
| Comparative Example | 6 | Comparative Polymer 1 (100) | PAG1 (14.0) | Quencher 1 (1.20) | — | PGMEA (2,000) | 22 | 5.3 | Pattern vanished |
|  | 7 | Comparative Polymer 2 (100) | PAG1 (14.0) | Quencher 1 (1.20) | — | PGMEA (2,000) | 29 | 5.0 | Pattern vanished |
|  | 8 | Comparative Polymer 3 (100) | PAG1 (14.0) | Quencher 1 (1.20) | — | PGMEA (2,000) | 33 | 5.0 | Pattern vanished |

As seen from Table 2, the resist compositions of Examples 13 to 26 did not flow away or vanish by heating as in Comparative Examples 6 to 8 and exhibited minimal line edge roughness. This is because the crosslinking reaction concomitant with heating is effective for suppressing thermal flow.

Dry Etch Resistance

For the dry etching test, the resist composition of Example 13 in Table 2 was chosen. In a run within the scope of the invention, after the resist solution was spin coated onto a silicon substrate, the coating was baked at 100° C. for 60 seconds and then at 200° C. for 60 seconds to form a film of 180 nm thick. In a comparative run, the coating was baked at 150° C. for 60 seconds to form a film of 180 nm thick. Note that the baking at 150° C. is the condition under which insufficient heat crosslinking occurs in the curing test of Table 1.

CHF$_3$/CF$_4$ Gas Etching Test

Using a dry etching instrument TE-8500P (Tokyo Electron Ltd.), the polymer film was etched with CHF$_3$/CF$_4$ gas under the following conditions. The difference in polymer film thickness before and after etching was determined.

| | |
| --- | --- |
| Chamber pressure | 40.0 Pa |
| RF power | 1000 W |
| Gap | 9 mm |
| CHF$_3$ gas flow rate | 30 ml/min |
| CF$_4$ gas flow rate | 30 ml/min |
| Ar gas flow rate | 100 ml/min |
| Time | 60 sec |

The results of the etching test are shown in Table 3.

TABLE 3

| | CHF$_3$/CF$_4$ gas etching rate (nm/min) |
| --- | --- |
| Inventive run | 128 |
| Comparative run | 135 |

It is evident from Table 3 that a notable improvement in film etch resistance is assigned to the baking by high-temperature heating according to the invention.

Double Patterning Test

On a substrate having an antireflective coating (ARC-29A, Nissan Chemical Industries, Ltd.) of 80 nm thick, each of the resist compositions of Examples 13, 20, 24, and 25 and Comparative Example 6 shown in Table 2 was spin coated, then baked on a hot plate at 110° C. for 60 seconds to form a resist film having a thickness of 120 nm.

The resist film was exposed by means of an ArF excimer laser scanner model NSR-S307E (Nikon Corp., NA 0.85, a 0.93, normal illumination, 6% halftone phase shift mask). Immediately after exposure, the resist film was baked (PEB) at 100° C. for 60 seconds and then developed for 30 seconds with a 2.38% aqueous solution of tetramethylammonium hydroxide, obtaining an isolated positive pattern (1st pattern) having a size of 70 nm and a pitch of 350 nm.

For the resist compositions of Examples 13, 20, 24 and Comparative Example 6, the coated wafer was exposed over its entire surface by an ArF excimer laser of wavelength 193 nm in an exposure dose of 50 mJ/cm$^2$ and baked at 200° C. for 60 seconds. For the resist composition of Example 25, after formation of the 1st pattern by development, it was baked at 200° C. for 60 seconds.

Next, the same resist composition was coated on the 1st pattern-bearing wafer so as to form a resist film of 120 nm thick, and baked. The coated wafer was exposed by means of an ArF excimer laser scanner in the same manner as the 1st pattern formation, but using a mask having a line pattern which was shifted 170 nm relative to the first line pattern on the wafer, followed by PEB and development.

For the resist compositions of Examples 13, 20, 24 and 25, the formation of a 2nd pattern having lines located between lines of the 1st pattern was observed. For the resist composition of Comparative Example 6, a 2nd pattern was formed, but the 1st pattern did not exist because it had been dissolved upon coating of the second resist material.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2007-035947 and 2007-211654 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, comprising the steps of:
applying a positive resist composition onto a substrate to form a resist film, the resist composition comprising a polymer and an acid generator,
heat treating the resist film and exposing it to high-energy radiation,
heat treating the exposed resist film and developing it with a developer,
then causing the resist film to crosslink and cure with the aid of acid and/or heat to form a first pattern,
applying another positive resist composition on the first pattern and the substrate to form another resist film,
heat treating and exposing the other resist film to high-energy radiation, and
heat treating and developing the other resist film with a developer to form a second pattern,
said polymer comprising recurring units (a-1) or (a-2) or both and recurring units which become soluble in an alkaline developer under the action of an acid, the recurring units (a-1) and (a-2) being represented by the general formula (1):

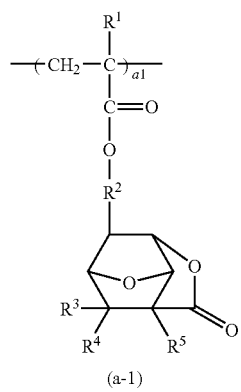

(a-1)

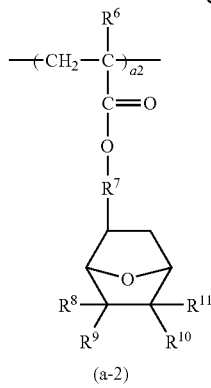

(a-2)

wherein $R^1$ and $R^6$ are each independently hydrogen, methyl or hydroxymethyl, $R^2$ and $R^7$ are each independently a single bond or a straight, branched or cyclic alkylene group of 1 to 6 carbon atoms, which may have an ether or ester group, with the proviso that when $R^2$ and $R^7$ each are a straight, branched or cyclic alkylene group of 1 to 6 carbon atoms, it has a carbon atom attached to the ester moiety in the formula, which is primary or secondary, $R^3$, $R^4$, $R^5$, $R^8$, $R^9$, $R^{10}$, and $R^{11}$ are each independently hydrogen or a straight, branched or cyclic alkyl group of 1 to 6 carbon atoms, a1 and a2 are numbers in the range: $0 \leq a1 < 1.0$, $0 \leq a2 < 1.0$, and $0 < a1+a2 < 1.0$.

2. The pattern forming process of claim 1 wherein the first pattern includes spaces where the other resist film is left behind to form the second pattern so that the distance between the patterns is reduced by one half.

3. The pattern forming process of claim 2 wherein after the first and second patterns are formed, the substrate is processed by dry etching.

4. The pattern forming process of claim 1 wherein the acid generator is a combination of an acid generator capable of generating an acid upon exposure and another acid generator capable of generating an acid upon heating at 150 to 400° C.

5. The pattern forming process of claim 1 wherein the step of causing the resist film to crosslink and cure with the aid of acid and/or heat after development includes exposure or heating to generate an acid from the resist film, then heating at 150 to 400° C. for crosslinking the resist film to turn it insoluble in a solvent and the alkaline developer.

6. The pattern forming process of claim 1 wherein the recurring units which become soluble in an alkaline developer under the action of an acid have the general formula (b):

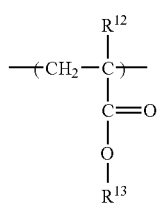

(b)

wherein $R^{12}$ is hydrogen, methyl or hydroxymethyl, and $R^{13}$ is an acid labile group.

7. A positive resist composition for use in the pattern forming process of claim 1, comprising a polymer, an organic solvent, and an acid generator, said polymer comprising recurring units (a-1) or (a-2) having the general formula (1) or both and recurring units having the general formula (b),

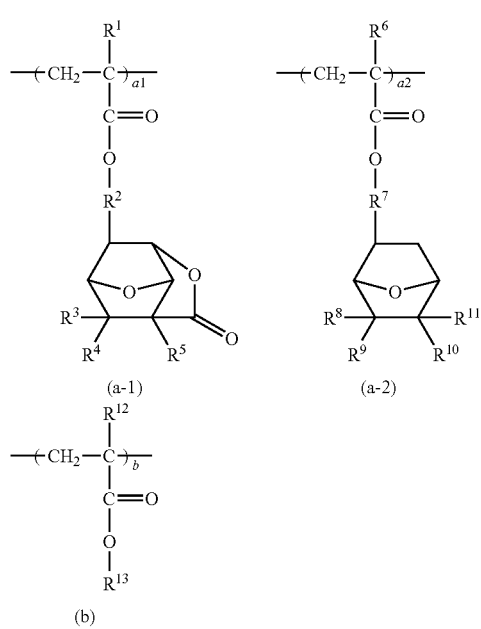

wherein $R^1$ and $R^6$ are each independently hydrogen, methyl or hydroxymethyl, $R^2$ and $R^7$ are each independently a single bond or a straight, branched or cyclic alkylene group of 1 to 6 carbon atoms, which may have an ether or ester group, with the proviso that when $R^2$ and $R^7$ each are a straight, branched or cyclic alkylene group of 1 to 6 carbon atoms, it has a carbon atom attached to the ester moiety in the formula which is primary or secondary, $R^3$, $R^4$, $R^5$, $R^8$, $R^9$, $R^{10}$, and $R^{11}$ are each independently hydrogen or a straight, branched or cyclic alkyl group of 1 to 6 carbon atoms, $R^{12}$ is hydrogen, methyl or hydroxymethyl, $R^{13}$ is an acid labile group; a1, a2 and b are numbers in the range: $0 \leq a1 < 1.0$, $0 \leq a2 \leq 1.0$, $0 < a1+a2 < 1.0$, $0 < b \leq 0.8$, and $0.1 \leq a1+a2+b \leq 1.0$, said acid generator being the combination of an acid generator having the general formula (P1a-1) and an acid generator having the general formula (P1a-2):

wherein $R^{101a}$, $R^{101b}$, and $R^{101c}$ are each independently a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, which may have at least one hydrogen atom substituted by an alkoxy group, or $R^{101b}$ and $R^{101c}$ may form a ring, and each of $R^{101b}$ and $R^{101c}$ is an alkylene group of 1 to 6 carbon atoms when they form a ring, $K^-$ is a sulfonic acid in which at least one alpha position is fluorinated, or a perfluoroalkyl imide acid or perfluoroalkyl methide acid, $R^{101d}$, $R^{101e}$, $R^{101f}$, and $R^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, which may have at least one hydrogen atom substituted by an alkoxy group, or $R^{101d}$ and $R^{101e}$, or $R^{101d}$, $R^{101e}$, and $R^{101f}$ may form a ring, and each of $R^{101d}$ and $R^{101e}$, or of $R^{101d}$, $R^{101e}$, and $R^{101f}$ is an alkylene group of 3 to 10 carbon atoms or a hetero-aromatic ring having incorporated therein the nitrogen atom in the formula, when they form a ring.

8. The positive resist composition of claim 7, further comprising a dissolution inhibitor.

9. The positive resist composition of claim 7, further comprising a basic compound and/or a surfactant as an additive.

10. The pattern forming process of claim 1 wherein said acid generator is the combination of an acid generator having the general formula (P1a-1) and an acid generator having the general formula (P1a-2):

wherein $R^{101a}$, $R^{101b}$, and $R^{101c}$ are each independently a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, which may have at least one hydrogen atom substituted by an alkoxy group, or $R^{101b}$ and $R^{101c}$ may form a ring, and each of $R^{101b}$ and $R^{101c}$ is an alkylene group of 1 to 6 carbon atoms when they form a ring, $K^-$ is a sulfonic acid in which at least one alpha position is fluorinated, or a perfluoroalkyl imide acid or perfluoroalkyl methide acid, $R^{101d}$, $R^{101e}$, $R^{101f}$, and $R^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, which may have at least one hydrogen atom substituted by an alkoxy group, or $R^{101d}$ and $R^{101e}$, or $R^{101d}$, $R^{101e}$, and $R^{101f}$ may form a ring, and each of $R^{101d}$ and $R^{101e}$, or of $R^{101d}$, $R^{101e}$, and $R^{101f}$ is an alkylene group of 3 to 10 carbon atoms or a hetero-aromatic ring having incorporated therein the nitrogen atom in the formula, when they form a ring.

11. The pattern forming process of claim 1 wherein the positive resist composition further comprises a dissolution inhibitor.

12. The pattern forming process of claim 1 wherein the positive resist composition further comprises a basic compound and/or a surfactant as an additive.

13. The pattern forming process of claim 1 wherein the other positive resist composition is a chemically amplified positive resist composition.

14. The pattern forming process of claim 1 wherein the other positive resist composition is the same resist composition for forming the first pattern.

* * * * *